US010051750B2

(12) United States Patent
Han et al.

(10) Patent No.: US 10,051,750 B2
(45) Date of Patent: Aug. 14, 2018

(54) DISPLAY DEVICE

(71) Applicant: LG ELECTRONICS INC., Seoul (KR)

(72) Inventors: Seokbong Han, Seoul (KR); Sooheon Kwak, Seoul (KR); Jiyeon Kwon, Seoul (KR); Hyungkwon Yun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/680,042

(22) Filed: Aug. 17, 2017

(65) Prior Publication Data
US 2018/0063971 A1 Mar. 1, 2018

(30) Foreign Application Priority Data

Aug. 25, 2016 (KR) .................. 10-2016-0108253

(51) Int. Cl.
*H05K 5/00* (2006.01)
*H05K 5/03* (2006.01)
(Continued)

(52) U.S. Cl.
CPC ......... *H05K 5/0017* (2013.01); *H05K 5/0204* (2013.01); *H05K 5/03* (2013.01); *F16M 11/041* (2013.01); *H05K 5/02* (2013.01)

(58) Field of Classification Search
CPC ...... F16M 11/041; F16M 11/10; F16M 13/02; G02F 1/133308; G02F 2001/133314;
(Continued)

(56) References Cited

U.S. PATENT DOCUMENTS 4,128,354 A * 12/1978 Amrogowicz ......... B65D 19/12
217/43 A
7,237,349 B2 * 7/2007 Huang .................. F16M 13/02
248/284.1
(Continued)

FOREIGN PATENT DOCUMENTS

KR 1020020073875 9/2002
KR 1020070113594 11/2007
(Continued)

OTHER PUBLICATIONS

PCT International Application No. PCT/KR2017/006779, International Search Report dated Oct. 10, 2017, 3 pages.

*Primary Examiner* — Dimary Lopez Cruz
*Assistant Examiner* — Abhishek Rathod
(74) *Attorney, Agent, or Firm* — Lee, Hong, Degerman, Kang & Waimey PC

(57) ABSTRACT

A display device is disclosed. The display device comprises a display panel; a module cover positioned at a rear of the display panel and fastened to the display panel; a bracket positioned at a rear of the module cover; and a tilting unit positioned between the module cover and the bracket, a portion of the tilting unit is formed at the module cover, and an another portion of the tilting unit is formed at the bracket, wherein the tilting unit includes: a first pin positioned near a right side of the display panel; a second pin positioned near a left side of the display panel; a first tilting hole, positioned near the right side of the display panel, in which the first pin is inserted, and having an elongated shape which is inclined with respect to a horizon; and a second tilting hole, positioned near the left side of the display panel, in which the second pin is inserted, and having an elongated shape which is inclined with respect to the elongated shape of the first tilting hole.

17 Claims, 37 Drawing Sheets

(51) Int. Cl.
*H05K 5/02* (2006.01)
*F16M 11/04* (2006.01)

(58) Field of Classification Search
CPC .... G02F 2001/133322; G02F 2201/46; H05K 5/03; H05K 5/0234; H05K 5/0204; H05K 5/02; H05K 13/04; H05K 5/0017
See application file for complete search history.

(56) References Cited

U.S. PATENT DOCUMENTS

| | | | | |
|---|---|---|---|---|
| 8,245,992 | B2* | 8/2012 | Matsui | F16M 13/02 248/224.51 |
| 2004/0232298 | A1* | 11/2004 | Bremmon | F16M 11/10 248/281.11 |
| 2005/0152102 | A1* | 7/2005 | Shin | F16M 11/10 361/679.29 |
| 2005/0161572 | A1* | 7/2005 | Rawlings | F16M 11/041 248/371 |
| 2007/0194191 | A1* | 8/2007 | Persson | F16M 13/02 248/225.11 |
| 2011/0290971 | A1* | 12/2011 | Molter | F16M 11/105 248/276.1 |
| 2012/0287356 | A1 | 11/2012 | Nonaka | |
| 2013/0306816 | A1* | 11/2013 | Yoshida | F16M 13/02 248/224.51 |
| 2016/0309599 | A1* | 10/2016 | Kikuchi | G09F 9/33 |

FOREIGN PATENT DOCUMENTS

| | | |
|---|---|---|
| KR | 100861690 | 10/2008 |
| KR | 2020120004399 | 6/2012 |

* cited by examiner

FIG. 14
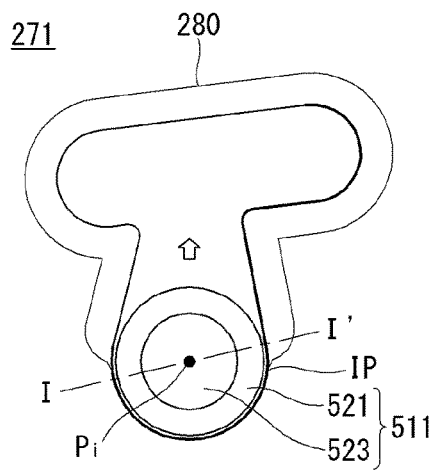
(a)
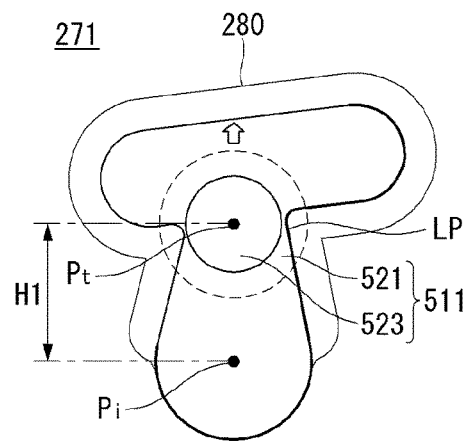
(b)
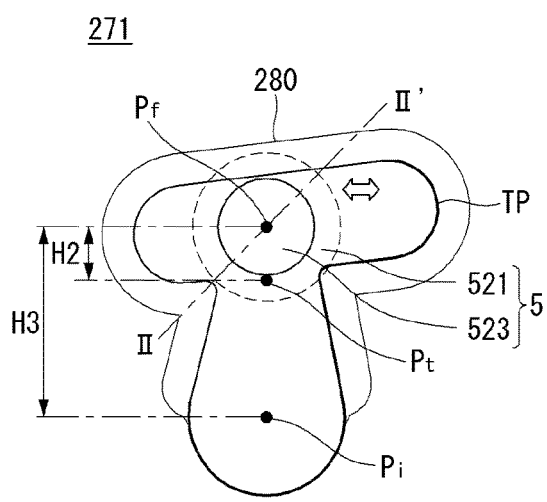
(c)
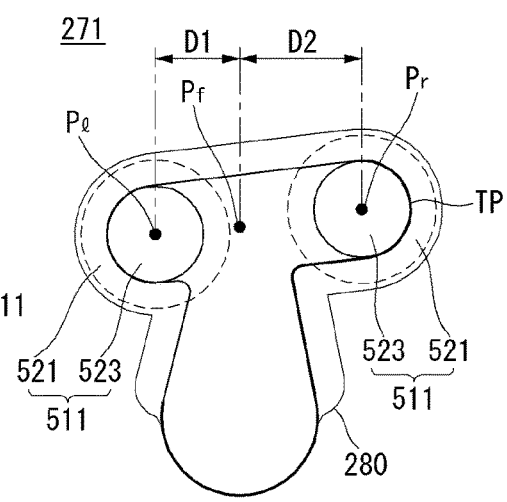
(d)

FIG. 33
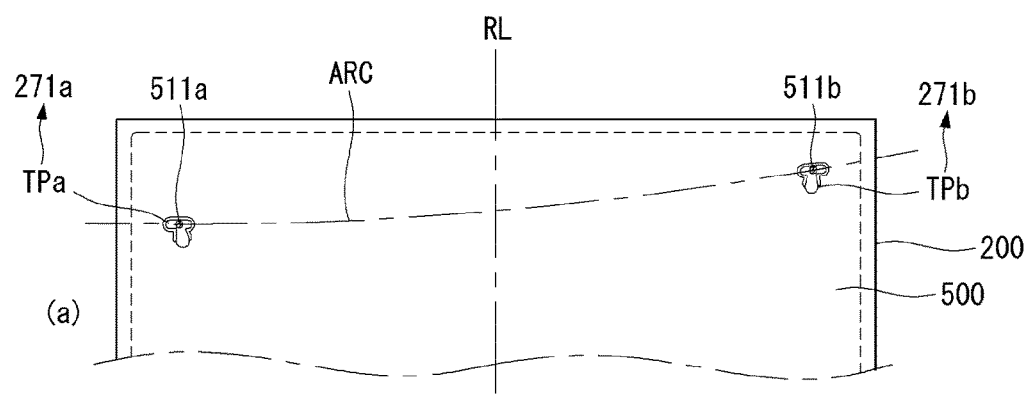
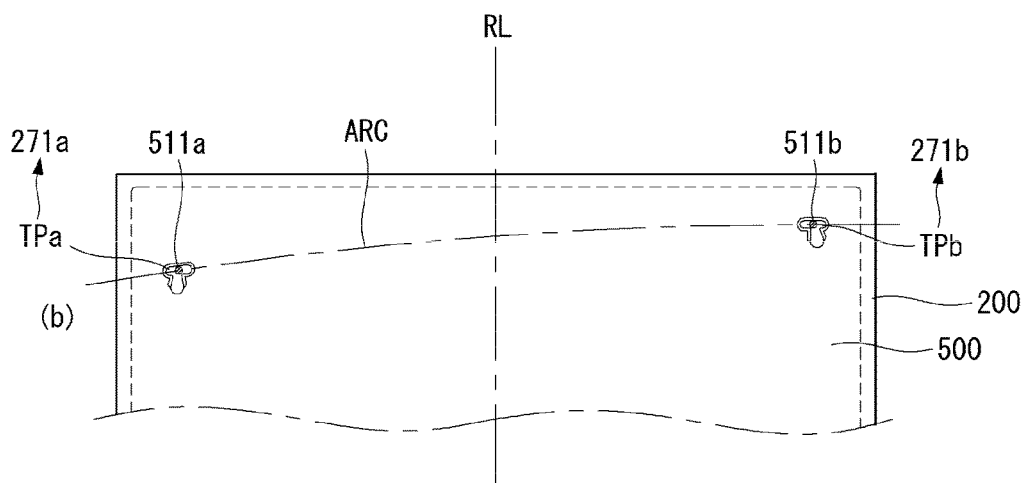

DISPLAY DEVICE

Pursuant to 35 U.S.C. § 119(a), this application claims the benefit of earlier filing date and right of priority to Korean Patent Application No. 10-2016-0108253, filed on Aug. 25, 2016, the contents of which are hereby incorporated by reference herein in its entirety.

BACKGROUND OF THE INVENTION

Field of the Invention

The present invention relates to a display device. Particularly, the present invention relates to a display device capable of finely adjusting a module cover fastened to a wall bracket to a desired position.

Discussion of the Related Art

With the development of the information society, various demands for display devices have been increasing. Various display devices, such as, e.g., liquid crystal displays (LCDs), plasma display panels (PDPs), electroluminescent displays (ELDs), and vacuum fluorescent displays (VFDs), have been studied and used to meet various demands for the display devices.

Among them, a display device using an organic light emitting diode (OLED) has an advantage of being excellent in brightness and viewing angle characteristics as compared with a liquid crystal display device. And a display device using an organic light emitting diode (OLED) has an advantage of being realized as an ultra thin type because it does not require a backlight unit.

Recently, much research has been conducted on the assembling structure of such a display device.

SUMMARY OF THE INVENTION

Accordingly, an object of the present disclosure is to address the above-described and other problems.

Another aspect of the present disclosure is to provide a display device provided with a module cover slidably fastened to a wall bracket.

Another aspect of the present disclosure is to provide a display device provided with a module cover capable of fine adjustment of attitude.

In one aspect, there is provided a display device, comprising: a display panel; a module cover fastened to a rear side of the display panel; and a bracket positioned at a rear of the module cover, the bracket comprising: a first pin positioned at a first area of a front of the bracket; a second pin positioned at a second area of the front of the bracket; wherein the module cover comprises: a first opening positioned at a first area of the module cover configured to accommodate the first pin, wherein at least a portion of the first opening is an elongated shape portion; and a second opening positioned at a second area of the module cover configured to accommodate the second pin, wherein at least a portion of the second opening is an elongated shape portion; wherein at least one of the elongated shape portions of the first opening or the second opening is inclined with respect to a horizontal axis.

According to another aspect of the present disclosure, the elongated shape portion of the first opening may be angled with respect to the horizontal axis and the elongated shape portion of the second opening may be angled with respect to the elongated shape portion of the first opening.

According to another aspect of the present disclosure, the elongated shape portion of the first opening and the elongated shape portion of the second opening may be both angled with respect to the horizontal axis.

According to another aspect of the present disclosure, the elongated shape portion of the first opening and the elongated shape portion of the second opening may be angled with respect to the horizontal axis at different angles.

According to another aspect of the present disclosure, the first area of the module cover may correspond to first half of a side of the module cover and the second area of the module cover may correspond to a second half of the side of the module cover adjacent to the first half.

According to another aspect of the present disclosure, the first pin may comprises a pin head having a first width and a pin neck connected to the pin head and having a second width, wherein the first width is greater than the second width; and the first opening may be defined to comprise: an insertion portion having a width greater than the first width into which the pin head can be inserted; a guide portion having a width less than the first width but greater than the second width and configured to accommodate the pin neck, wherein the insertion portion is in communication with the guide portion.

According to another aspect of the present disclosure, the guide portion may have an elongated shape and the pin may be moveable between a first end of the guide portion to a second end of the guide portion.

According to another aspect of the present disclosure, the guide portion may be positioned above the insertion portion.

According to another aspect of the present disclosure, the first opening may be defined to further comprise a link portion between the guide portion and the insertion portion. A width of the link portion may narrow from a first side near the insertion portion to a second side near the guide portion.

According to another aspect of the present disclosure, a first end of the guide portion may be disposed at a left side of the insertion portion and a second end of the guide portion may be disposed at a right side of the insertion portion.

According to another aspect of the present disclosure, the first end of the guide portion and the second end of the guide portion may be disposed on opposite sides of the insertion portion.

According to another aspect of the present disclosure, the insertion portion may be circular.

According to another aspect of the present disclosure, the first opening and the second opening may be symmetric with respect to an axis dividing the first area and the second area of the module cover.

According to another aspect of the present disclosure, The module cover may further comprise corresponding forming portions around the first opening and the second opening protruding toward the display panel.

According to another aspect of the present disclosure, the module cover may further comprise a friction member disposed around at least a portion of the guide portion at a front side of the module cover, and the friction member may be configured to contact a rear surface of the pin head to restrict movement of the pin when the pin neck is inserted into the guide portion.

According to another aspect of the present disclosure, a first center axis of the elongated shape portion of the first opening and a second center axis of the elongated shape portion of the second opening may correspond to tangent lines to a shared arc.

According to another aspect of the present disclosure, the shared arc may correspond to a circle wherein a center point of the circle is located above the first and second openings.

In another aspect, there is provided a display device, comprising: a display panel; a bracket; a module cover positioned at a rear of the display panel, the module cover comprising: a first pin positioned at a first area of the module cover; a second pin positioned at a second area of the module cover; wherein the bracket comprises: a first opening positioned at a first area of the bracket configured to accommodate the first pin, wherein at least a portion of the first opening is an elongated shape portion; and a second opening positioned at a second area of the bracket configured to accommodate the second pin, wherein at least a portion of the second opening is an elongated shape portion; wherein at least one of the elongated shape portions of the first opening or the second opening is inclined with respect to a horizontal axis.

An effect of the display device according to the present disclosure is described below.

According to at least one aspect of the present disclosure, a module cover of the display device may be slidably fastened to a wall bracket of the display device.

According to at least one aspect of the present disclosure, the module cover may be easily aligned from the current position to the desired position.

According to at least one aspect of the present disclosure, an attitude of the module cover may be adjusted by a tilting operation.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 12 to 17 are views showing examples of a fixing pin and a tilting hole according to an embodiment of the present invention.

FIGS. 33 to 37 are views illustrating couplings of openings with pin, according to various embodiments of the present invention.

DETAILED DESCRIPTION OF THE EMBODIMENTS

Figure 1:
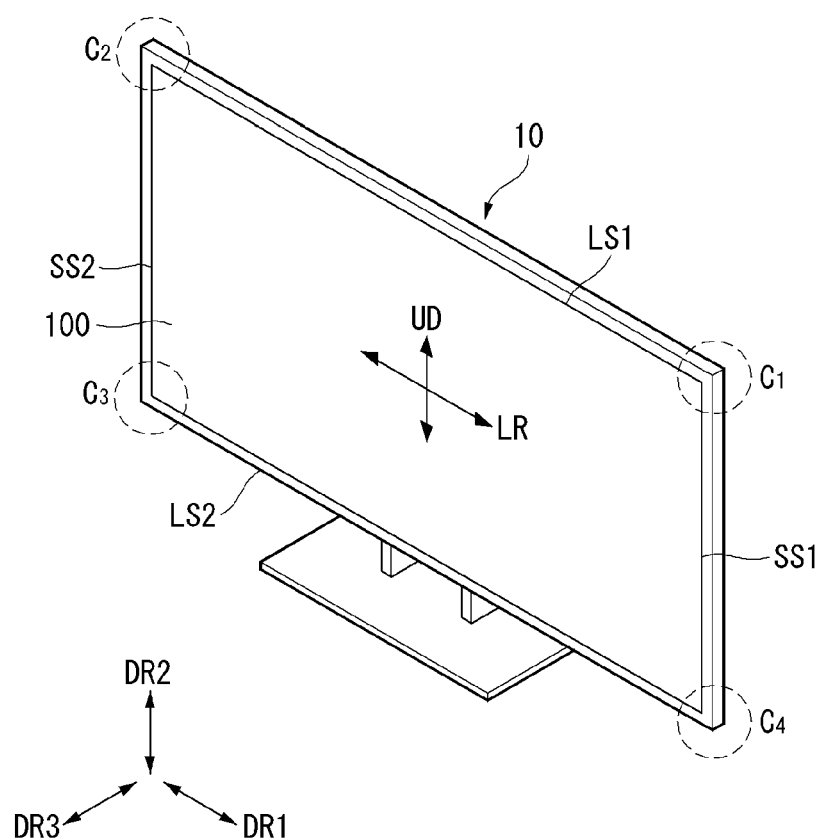
FIGS. 1 to 8 are views showing examples of display devices related to the present invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

The display device according to the present invention may be applied to a liquid crystal display (LCD), a field emission display (FED), a plasma display panel (PDP), an organic light emitting diode (OLED), an electrophoresis (EPD) device, a quantum dot display (QDD) device, and etc. Hereinafter, for convenience of explanation, the case where the display device includes the organic light emitting diode element will be described as an example.

Referring to FIG. 1, a display device 100 or a head 10 may include a first long side LS1, a second long side LS2 opposite the first long side LS1, a first short side SS1 adjacent to the first long side LS1 and the second long side LS2, and a second short side SS2 opposite the first short side SS1.

In the embodiment disclosed herein, the first short side SS1 may be referred to as a first side area; the second short side SS2 may be referred to as a second side area opposite the first side area; the first long side LS1 may be referred to as a third side area which is adjacent to the first side area and the second side area and is positioned between the first side area and the second side area; and the second long side LS2 may be referred to as a fourth side area which is adjacent to the first side area and the second side area, is positioned between the first side area and the second side area, and is opposite to the third side area.

The embodiment of the invention describes that lengths of the first and second long sides LS1 and LS2 are longer than lengths of the first and second short sides SS1 and SS2 for the sake of brevity and ease of reading. However, the lengths of the first and second long sides LS1 and LS2 may be almost equal to the lengths of the first and second short sides SS1 and SS2.

In the following description, a first direction DR1 may be a direction parallel to the long sides LS1 and LS2 of the display device 100, and a second direction DR2 may be a direction parallel to the short sides SS1 and SS2 of the display device 100.

Further, a third direction DR3 may be a direction vertical to the first direction DR1 and/or the second direction DR2.

In the embodiment disclosed herein, the first direction DR1 and the second direction DR2 may be commonly referred to as a horizontal direction. Further, the third direction DR3 may be referred to as a vertical direction.

In another point of view, a side or a surface, on which the display device 100 displays an image, may be referred to as a front side or a front surface. When the display device 100 displays the image, a side or a surface, at which the image cannot be observed, may be referred to as a back side or a back surface. When the display device 100 is observed at the front side or the front surface, the first long side LS1 may be referred to as an upper side or an upper surface. In the same manner as the first long side LS1, the second long side LS2 may be referred to as a lower side or a lower surface. Further, the first short side SS1 may be referred to as a left side or a left surface, and the second short side SS2 may be referred to as a right side or a right surface.

Further, the first long side LS1, the second long side LS2, the first short side SS1, and the second short side SS2 may be referred to as edges of the display device 100. Positions where the first long side LS1, the second long side LS2, the first short side SS1, and the second short side SS2 meet one another may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

In the embodiment disclosed herein, a direction from the first short side SS1 to the second short side SS2 or a direction from the second short side SS2 to the first short side SS1 may be referred to as a left-right direction LR. A direction from the first long side LS1 to the second long side LS2 or from the second long side LS2 to the first long side LS1 may be referred to as an up-down direction UD.

Figure 2:
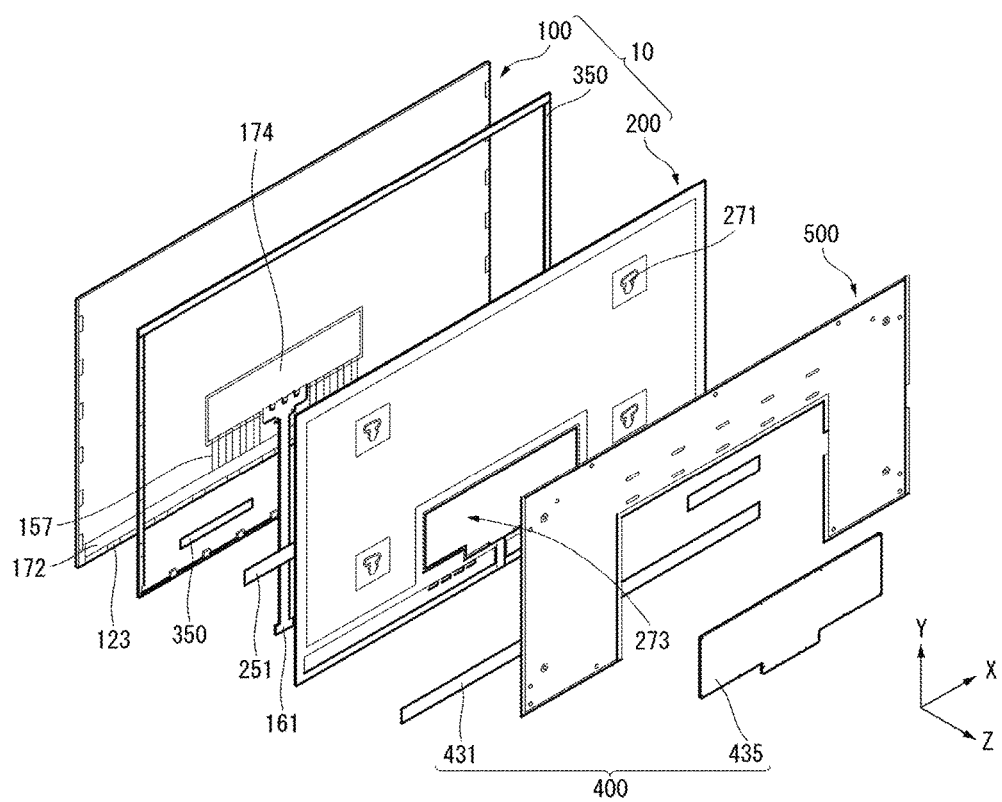

Referring to FIG. 2, the display device may include a head portion 10 and a wall bracket 500. The head portion 10 may include a display panel 100, a module cover 200, and a PCB cover 400. The module cover 200 may be referred to as a frame 200. The wall bracket 500 can be referred to as a bracket 500.

The display panel 100 is provided on the front surface of the head portion 10 and can display images. The display panel 100 may output an image by dividing the image into a plurality of pixels and controlling the color, brightness, and saturation of each pixel to emit light.

The interface PCB 174 and the at least one source PCB 172 may be located on at least a portion of the backside of the display panel 100. The interface PCB 174 may be located above the at least one source PCB 172. At least one source PCB 172 may be coupled to the interface PCB 174. Each source PCB 172 may be spaced apart from one another. The FFC 157 may be located between the source PCB 172 and the interface PCB 174. The FFC 157 can electrically connect the source PCB 172 and the interface PCB 174.

The interface PCB 174 may be positioned with signal lines for transmitting digital video data and timing control signals transmitted from the timing controller board of the housing.

At least one source PCB 172 may apply a voltage to the display panel 100 in accordance with a signal transmitted from the interface PCB 174. That is, at least one source PCB 172 may apply a driving waveform to the display panel 100 according to a video signal. The source PCB 172 may be connected to the display panel 100 by a source COF (Chip On Film) 123. The source COF 123 connected to the source PCB 172 may extend to the lower surface of the display panel 100 and be connected to the display panel 100.

The source COF 123 may be electrically connected to the source PCB 172 and the data pads of the display panel 100. The source COF 123 can implement a data integrated circuit.

The adhesive sheet 350 may be positioned on the rear surface of the display panel 100 in order to couple the display panel 100 and the module cover 200 together. The adhesive sheet 350 may be in the form of a rectangular frame with an empty center. Since the center of the adhesive sheet 350 is empty, at least one PCB may be located in the empty space.

The insulating sheet 251 may be located in correspondence with the source PCB 172. The insulating sheet 251 may be attached to the front surface of the module cover 200. The insulating sheet 251 may include an insulating material such that the source PCB 172 is not interfered with by other electronic devices. For example, the PCB cover 400 may comprise a plastic material. Accordingly, the PCB cover 400 can protect the source PCB 172 from a leakage current.

The module cover 200 may be positioned on the rear surface of the display panel 100. The module cover 200 may be attached to the display panel 100 through the adhesive sheet 350. The module cover 200 can support the rear surface of the display panel 100. That is, the module cover 200 can reinforce the rigidity of the display panel 100. The module cover 200 may include a lightweight and high strength material. For example, the module cover 200 may comprise aluminum.

The module cover 200 may have a different thickness depending on the position. The module cover 200 may be formed. The thickness of the edge region of the module cover 200 may be greater than the thickness of the other portions of the module cover 200. Since the module cover 200 is formed, the rigidity of the module cover 200 can be improved.

A tilting hole 271 may be located in the module cover 200. The tilting hole 271 may penetrate through the module cover 200. The specific shape and position of the tilting hole 271 will be described later. The tilting hole 271 may stand for an opening 271. The tilting hole 271 can be referred to as the opening 271.

The opening 273 may be formed in the module cover 200 at a position corresponding to the interface PCB 174. For example, the opening 273 may be located at the center of the module cover 200. The opening 273 provides a space for the interface PCB 174 to be positioned between the display panel 100 and the module cover 200. If the area of the opening 273 in the module cover 200 is large, a crack may be formed in the module cover 200 or the rigidity of the module cover 200 may be weakened. Accordingly, it is preferable that the opening 273 of the module cover 200 is formed small.

The PCB may be understood to mean at least one of the interface PCB 174 and the source PCB 172. A PCB cover 400 may be provided on the back side of the area where the PCB is located. The PCB cover 400 may include first and second PCB covers 431 and 435. The first PCB cover 431 may be located in correspondence with the source PCB 172. The second PCB cover 435 may be located in correspondence with the interface PCB 174. The second PCB cover 435 may cover the opening 273. The PCB cover 400 may prevent the source PCB 172 and the interface PCB 174 from being exposed to the outside. PCB cover 400 may be opaque so that source PCB 172 and interface PCB 174 are not visible from the outside.

PCB cover 400 may include an insulating material such that source PCB 172 and interface PCB 174 are not interfered with by other electronic devices. For example, the PCB cover 400 may comprise plastic. Accordingly, the PCB cover 400 can protect the source PCB 172 and the interface PCB 174 from leakage currents.

The display panel 100 can be supported by only the module cover 200. That is, the head portion 10 may not include the cover other than the module cover 200. Accordingly, the user can feel that the thickness of the head portion 10 is very thin, and can concentrate more on the display screen.

Figure 3:
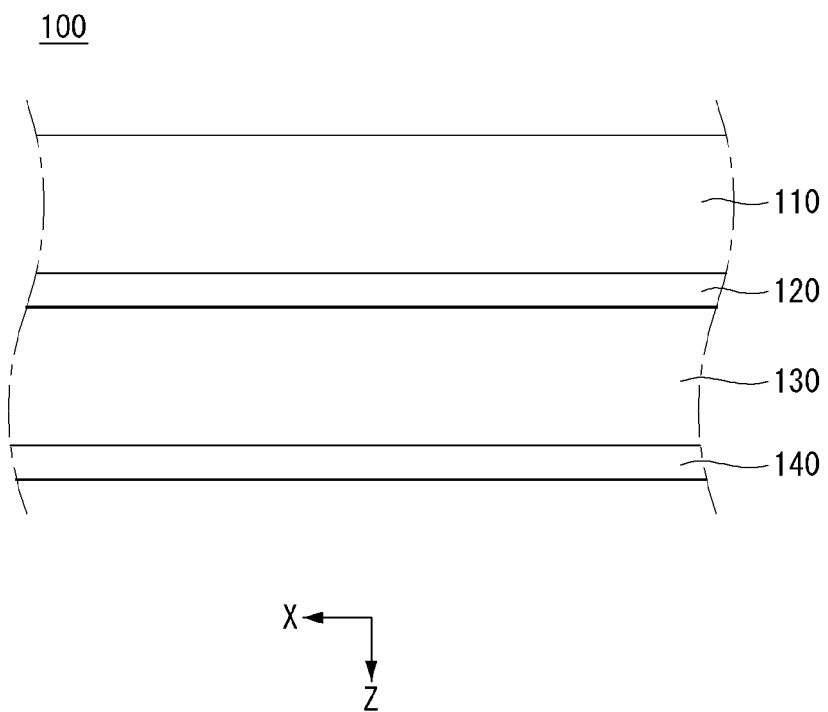

Referring to FIG. 3, the display panel 100 may include a transparent substrate 110, an upper electrode 120, an organic light emitting layer 130, and a lower electrode 140. The transparent substrate 110, the upper electrode 120, the organic light emitting layer 130, and the lower electrode 140 may be sequentially formed.

The transparent substrate 110 and the upper electrode 120 may include a transparent material. The lower electrode 140 may include a non-transparent material. The lower electrode 140 may include a transparent material (for example, ITO). In this case, light may be emitted to a surface of the lower electrode 140.

When a voltage is applied to the upper electrode 120 and lower electrode 140, light emitted from the organic light emitting layer 130 may be transmitted through the upper electrode 120 and the transparent substrate 110 to be emitted to the outside. At this time, a light shielding plate may be further formed behind the lower electrode 140 to emit the light emitted to the lower electrode 140 to the front surface.

The display device 100 may be an OLED display device. The OLED display devices may not need a light source and may have reduced volume and weight. Also, OLED display devices have a response speed that is 1000 times faster than a liquid crystal display device, so there may be no afterimage when displaying an image.

Figure 4:
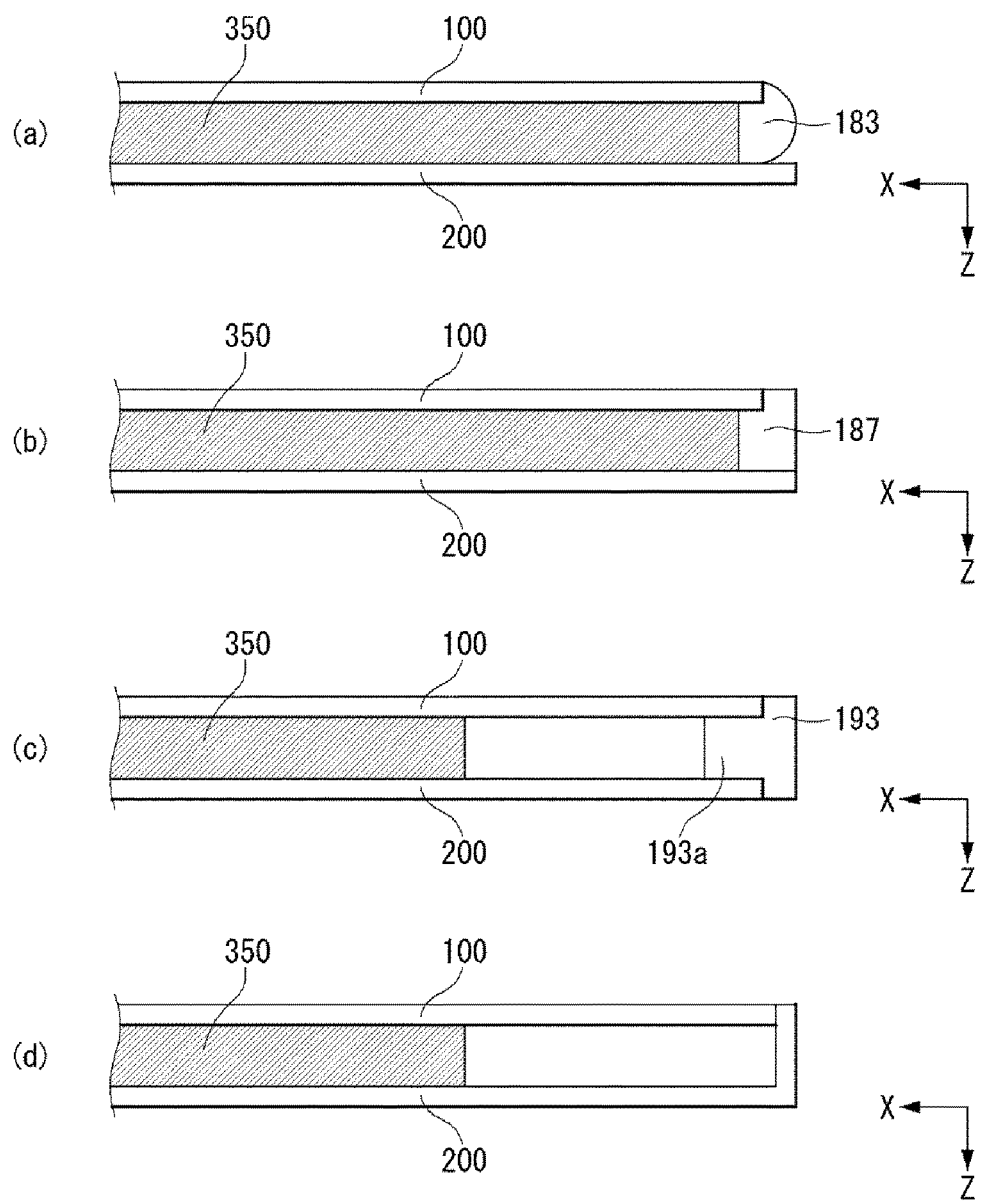

Referring to FIG. 4, the display panel 100 may be attached to the module cover 200 by an adhesive sheet 350. The adhesive sheet 350 may include a double-sided tape.

The adhesive sheet 350 may have a thickness. Accordingly, foreign substances or dust may enter between the display panel 100 and the module cover 200. In order to prevent this, as shown in FIG. 4 (a), the sealing member 183 can be side-sealed to at least a side of the adhesive sheet 350. The sealing member 183 can shield at least one side of the adhesive sheet 350 and the display panel 100 at the same time.

As another example, the frame 187 may be inserted into at least one side of the adhesive sheet 350, as shown in FIG. 4 (b). The frame 187 may contact at least one side of the adhesive sheet 350 and may be bent so that one end of the frame 187 extends toward the display panel 100. Accordingly, at least one side of the display panel 100 can be simultaneously shielded.

As another example, the middle cabinet 193 may be positioned between the display panel 100 and the module cover 200, as shown in FIG. 4 (c). The middle cabinet 193 can guide the position where the display panel 100 is coupled. The flange 193a of the middle cabinet 193 can be inserted between the display panel 100 and the module cover 200. The middle cabinet 193 can shield at least one side of the display panel 100 and the module cover 200 at the same time.

The flange 193a of the middle cabinet 193 may be spaced apart from the adhesive sheet 350. Accordingly, since the adhesive sheet 350 does not need to be entirely placed on the display panel 100, the amount of the adhesive sheet 350 for the display device can be reduced.

As another example, the edge portion of the module cover 200 may be bent toward the display panel 100, as shown in FIG. 4 (d). Since the edge portion of the module cover 200 is bent, at least one side of the adhesive sheet 350 can be shielded from the outside.

In this case, other materials may not be included between the display panel 100 and the module cover 200. Thus, the manufacturing process of the display device can be simplified, and the cost can be saved. Further, the edge of the module cover 200 can be separated from the adhesive sheet 350. Accordingly, since the adhesive sheet 350 does not need to be entirely placed on the display panel 100, the amount of the adhesive sheet 350 for the display device can be reduced.

In the following embodiments, the structures located on the side surfaces of the adhesive sheet 350 are omitted for convenience of explanation. The structures located on the side surface of the adhesive sheet 350 are applicable to other embodiments.

Figure 5:
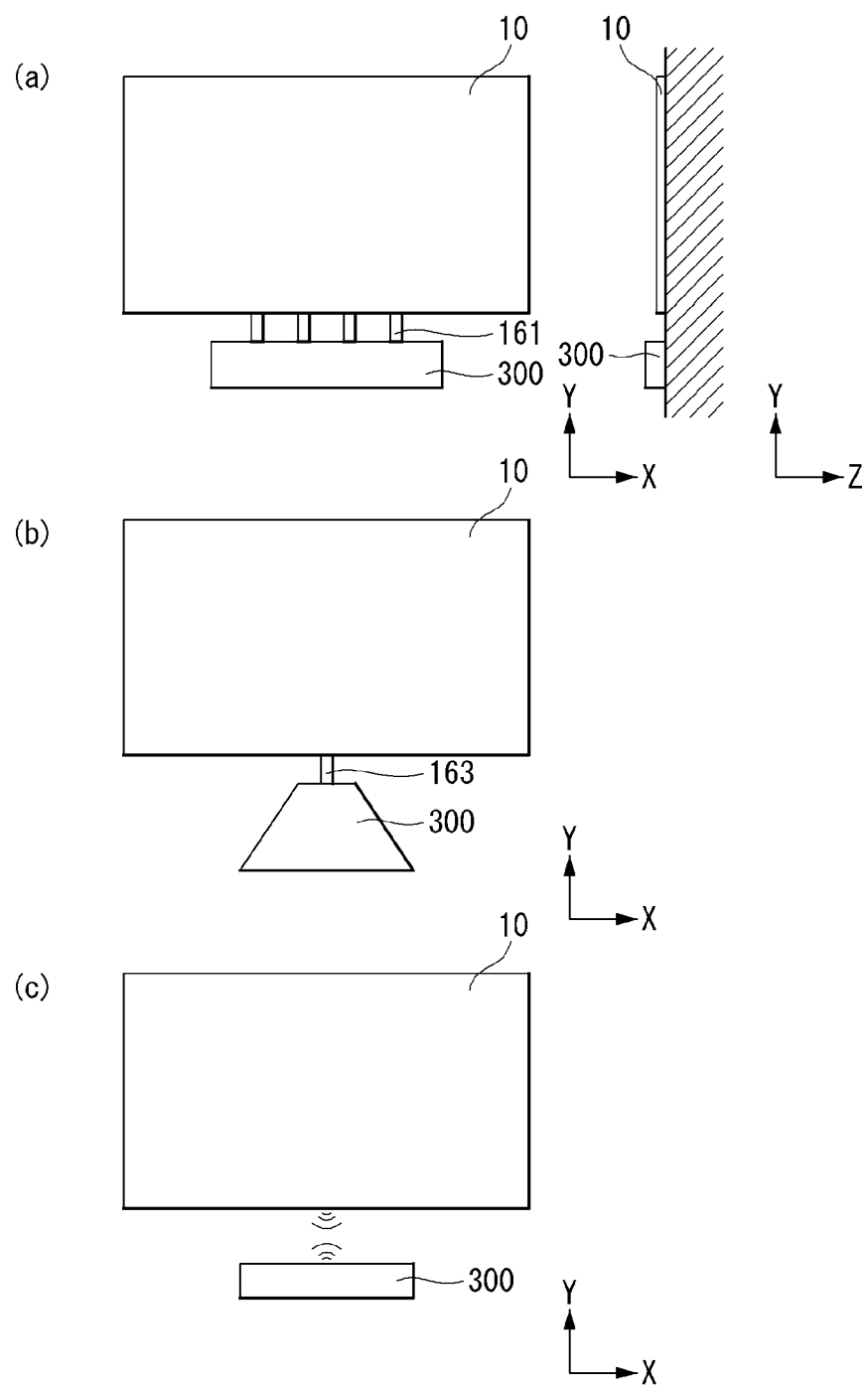

Referring to FIG. 5, the display device may include a housing 300 electrically connected to the head portion 10.

The housing 300 can transmit at least one signal to the head portion 10. The housing 300 may shield the components that drive the display device. For example, the housing 300 may shield at least one printed circuit board (PCB). The detailed coupling structure of the at least one printed circuit board and the method of coupling the at least one printed circuit board will be described later.

The housing 300 may be spaced apart from each other without contacting the head portion 10. That is, the housing 300 may not be positioned on the display screen display portion. Accordingly, the user can concentrate more on the display screen.

For example, as shown in FIG. 5A, the housing 300 may be connected to the head unit 10 through a plurality of flat cables 161 having a flat shape. The flat cable 161 may include a plurality of signal connection terminal pins and at least one ground terminal pin for connecting the housing 300 and the head unit 10. The flat cable 161 is advantageous in cost compared to other cables.

As another example, as shown in FIG. 5 (b), the housing 300 can be engaged with the head portion 10 through one circular cable 163. That is, a plurality of flat cables 161 in FIG. 3 (b), can be connected through a single circular cable 163 in FIG. 5(b). Since the housing 300 and the head unit 10 are connected through a single circular cable 163 rather than a plurality of circular cables 163, the user can feel that the appearance is cleaner.

As another example, as shown in FIG. 5 (c), the housing 300 and the head unit 10 can exchange electric signals wirelessly. In this case, the user may feel that the appearance is cleaner than when the housing 300 and the head portion 10 are connected through the flat cable 161 or the circular cable 163.

The display device may have the head portion 10 and the housing 300 separated from each other. Thus, the user can concentrate on the display screen more and a display device having a thinner head portion 10 can be implemented.

Figure 6:
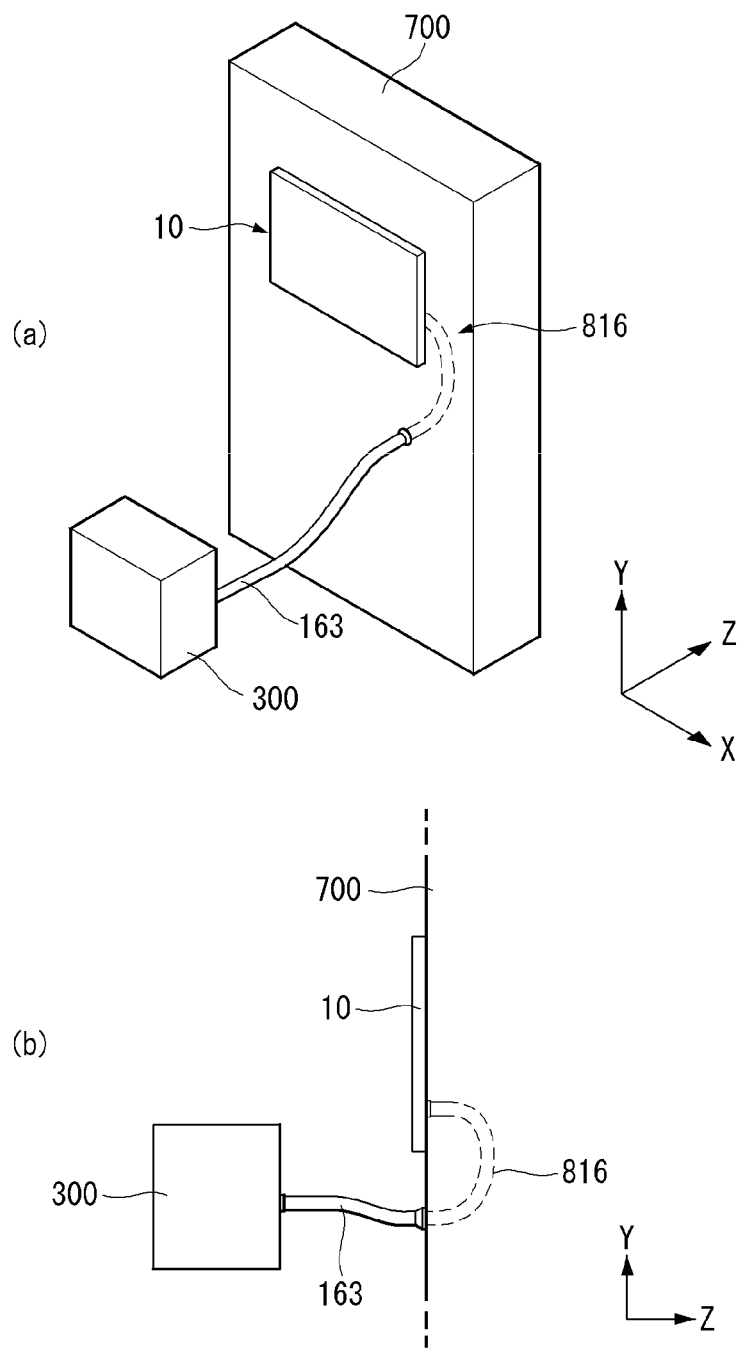

Referring to FIG. 6, the display device can exchange electric signals with the housing 300 through the electric wire 816 passing through the inside of the attachment surface 700 to which the head portion 10 is attached. In this case, the head portion 10 can be connected to the electric wire 816.

The electric wire 816 can be inserted into the penetrating portion of the attachment surface 700. The electric wire 816 may be connected to the head portion 10 at a side and to the circular cable 163 at another side. The electric wire 816 can be located in the attached surface 700 and may not be seen to the user.

The display device can connect the head unit 10 and the housing 300 through the electric wire 816 inserted into the attachment surface 700. Accordingly, the user can see as if the housing 300 and the head portion 10 are not directly connected. Thus, the user may feel that the appearance is cleaner and can concentrate on the display screen.

Figure 7:
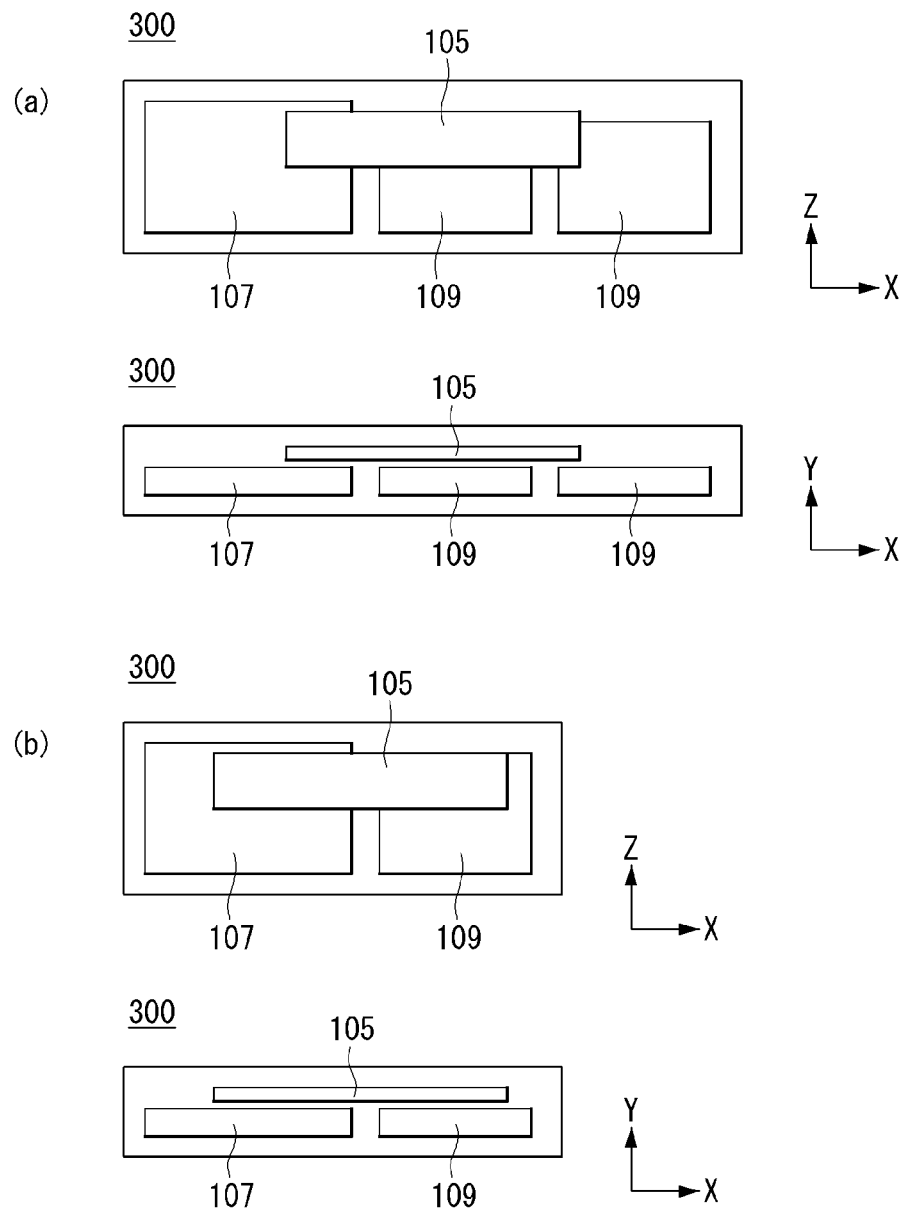

Referring to FIG. 7, at least one PCB may be positioned inside the housing 300. Each PCB may be spaced apart.

For example, the at least one PCB may be the main board 109. The main board 109 may provide an interface for the display device to operate. In addition, the main board 109 can check and manage the operation states of the respective components of the display device to make the optimal state.

As another example, the at least one PCB may be a power supply 107. The power supply 107 can supply power to the display device. That is, the power supply 107 can supply power to the head portion. The power supply 107 can change the AC power to the DC power.

As another example, the at least one PCB may be the timing controller board 105. The timing controller board 105 can transmit an input signal to the display panel. That is, the timing controller board 105 can transmit the timing signals (CLK, LOAD, SPi) for controlling the source PCB and the video signals (R, G, B) to the source PCB. In addition, the timing controller board 105 can control an image. The timing controller board 105 may be connected to the interface PCB via either a flat cable, a circular cable, or wireless transmission.

As shown in FIG. 7 (a), the main board 109 is located at the center and the right side of the housing 300, but may be spaced apart from each other. The power supply 107 may be located on the left side of the housing 300.

The timing controller board 105 may be located on the upper surface of the main board 109 and the power supply 107. Since the timing controller board 105 is located on the upper surface of the main board 109 and the power supply 107, the internal space of the housing 300 can be saved.

Although not shown, a T-con shield may be attached to a position where the timing controller board 105 is to be mounted in order to prevent electromagnetic waves emitted from the power supply 107 and the main board 109. That is, the timing controller board 105 can be coupled onto the T-con shield, not the power supply 107 and the main board 109. Accordingly, the power supply 107 and the main board 109 and the timing controller board 105 may not interfere with each other. In addition, the T-con shield can protect the timing controller board 105 from impact.

The timing controller board 105 may overlap the power supply 107 and the main board 109 in the height direction of the housing 300. Accordingly, the timing controller board 105 can be more easily coupled to the power supply 107 and the main board 109.

As shown in FIG. 7 (b), one main board 109 may be mounted inside the housing 300. That is, the main board 109 is located at a side of the housing 300, and the power supply 107 can be positioned facing the main board 109 in the longitudinal direction of the main board 109.

The display device can save space because the timing controller board 105 is located above the power supply 107 and the main board 109. Accordingly, the entire size of the housing 300 is reduced, and the user can feel that the display device is improved in appearance.

Figure 8:
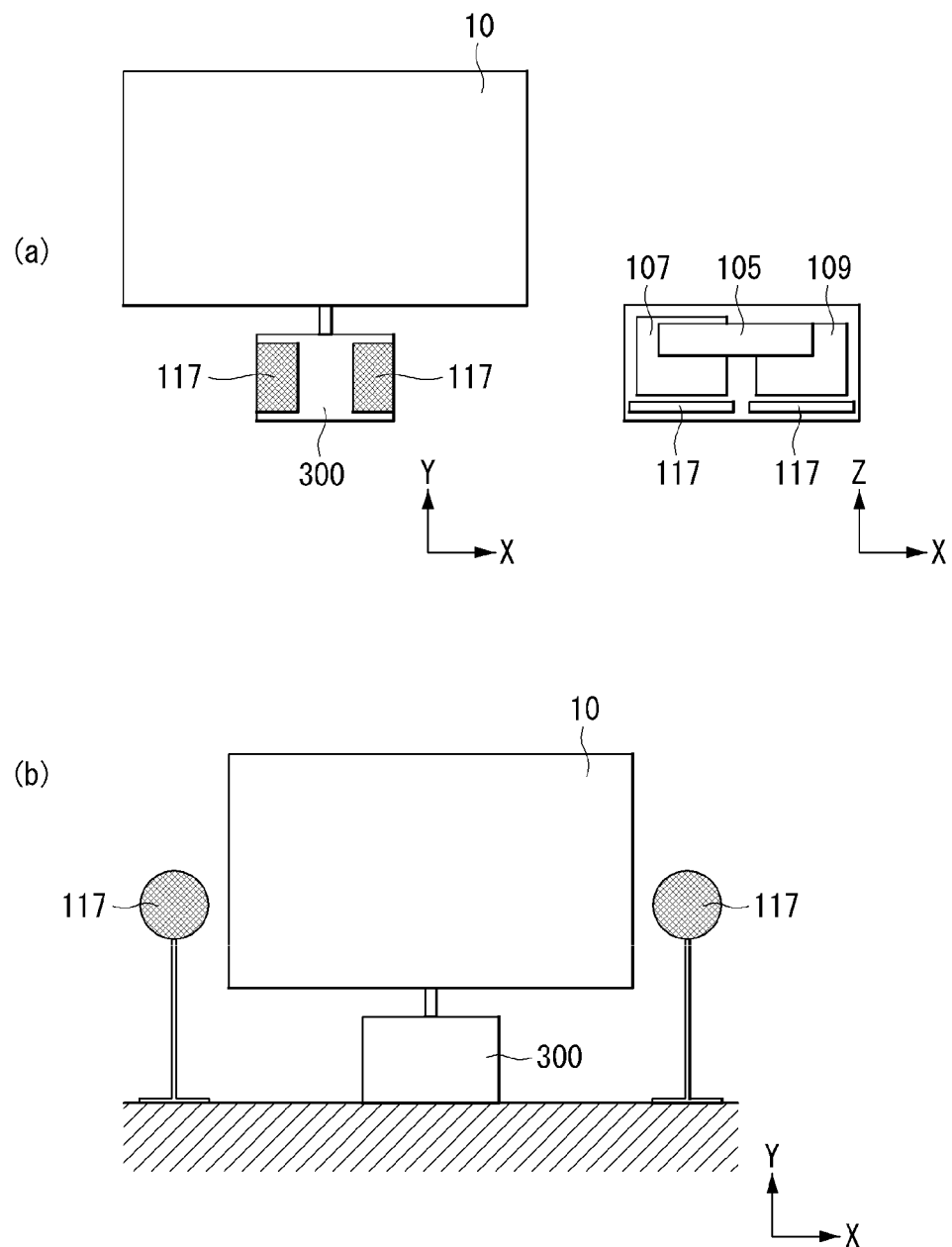

Referring to FIG. 8, the display device may include speakers 117 on both sides of the front surface of the housing 300. The speaker 117 can output and transmit sound to the user. Accordingly, it may be more efficient for the speaker 117 to be located on the front surface of the housing 300.

As shown in FIG. 8 (a), the speaker 117 may be mounted on the front surface of the housing 300, spaced apart from at least one PCB mounted inside the housing 300. Alternatively, as shown in FIG. 8 (b), the speaker 117 may be positioned apart from the housing 300. Since the speaker 117 is located outside the housing 300, the user can place the speaker 117 at a position where sound can be transmitted to the user. The speaker 117 may be positioned on both sides of the head portion 10 of the display device.

The speaker 117 of the display device may be located on both sides of the front or outer side of the housing 300. Accordingly, the user can receive the sound of the display device more easily.

Hereinafter, the structure of the wall bracket 500 and the module cover 200 will be described with reference to FIGS. 9 to 11.

Figure 9:
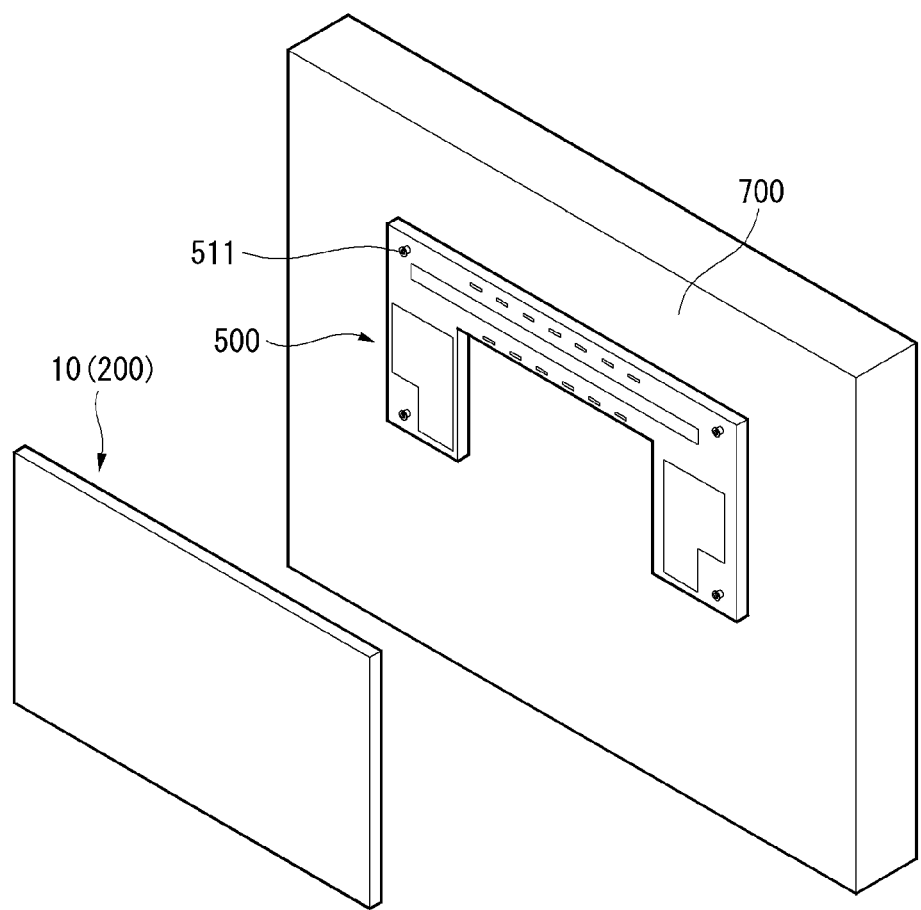
FIGS. 9 to 11 are views showing examples of wall bracket and module cover according to an embodiment of the present invention.
Figure 10:
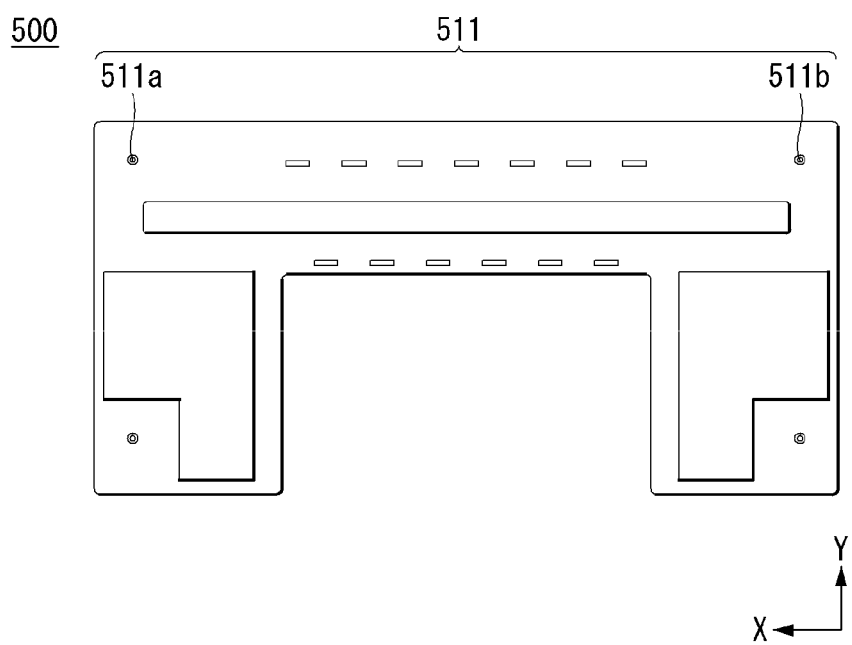
Figure 11:
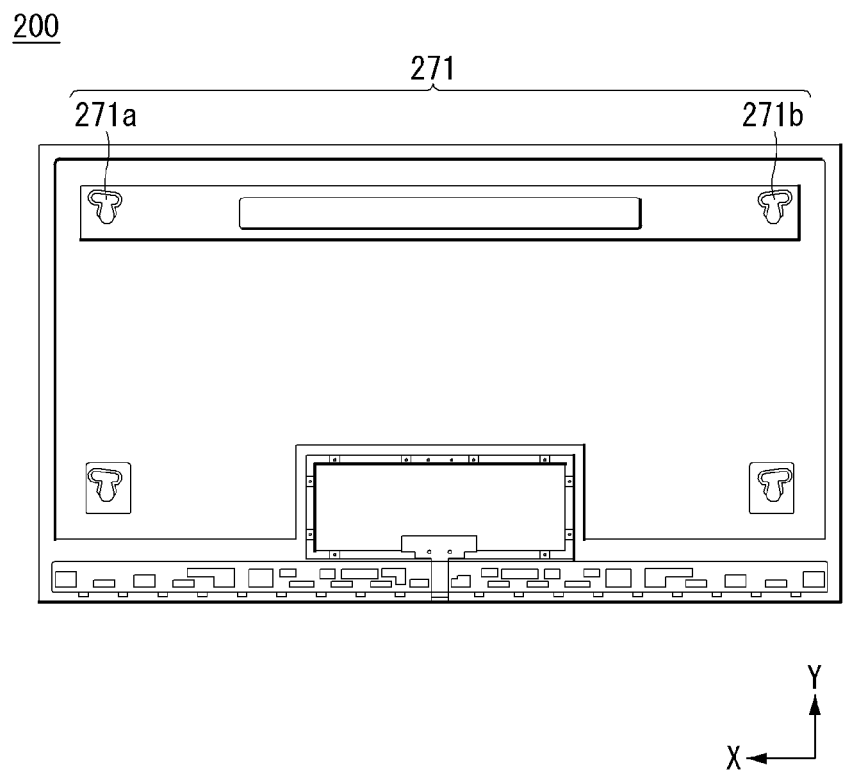

Referring to FIGS. 9 to 11, the display device may include a wall bracket 500 and a head portion 10. The wall bracket 500 may be secured to a fixed body, such as a wall. That is, the wall bracket 500 may be fixed at predetermined position, such as a wall surface, so that the motion can be restrained. The attachment surface 700 means a surface of the fixed body to which the wall bracket 500 is fixed. The wall bracket 500 may be secured to the attachment surface 700 via a fixing member such as a screw.

The first fixing pin 511a may be located on one of the left and right sides of the wall bracket 500 and the second fixing pin 511b may be located on the other of the left and right sides of the wall bracket 500. For example, the first fixing pin 511a may be positioned in a first area of the bracket 500, and the second fixing pin 511a may be positioned in a second area of the bracket 500. A fixing pin 511 may mean at least one of the first fixing pin 511a and the second fixing pin 511b. A first pin 511a may mean the first fixing pin 511a. A second fixing pin 511b may mean the second fixing pin 511b. A pin 511 may mean the fixing pin 511. The first pin 511a may be located at a first area of a front of the bracket 500. The first area of the bracket 500 may mean left half of the bracket 500. The second pin 511b may be located at a second area of a front of the bracket 500. The second area of the bracket 500 may mean right half of the bracket 500. The left and right halves of the bracket 500 may mean two halves aligned horizontally.

The first and second fixing pins 511a and 511b can support the load of the head portion 10 fastened to the wall bracket 500. In order to disperse the load of the head portion 10, the wall bracket 500 may be provided with two or more pairs of first and second fixing pins 511a and 511b.

The head portion 10 may include a module cover 200 to which the display panel is coupled. The module cover 200 may include at least a pair of first tilting hole 271a and second tilting hole 271b. A tilting hole 271 may mean at least one of the first tilting hole 271a and the second tilting hole 271b. A first opening 271a may designate the first tilting hole 271a. A second opening 271b may designate the second tilting hole 271b. Opening 271 may stand for the tilting hole 271.

The first and second tilting holes 271a and 271b of the module cover 200 may be provided at positions in accordance with the first and second fixing pins 511a and 511b when the head portion 10 is fastened to the wall bracket 500. That is, the first tilting hole 271a may be located on one of the left and right sides of the module cover 200, and the second tilting hole 271b may be located on the other of the left and right sides of the module cover 200. In other words, the first opening 271a may be positioned in a first area or a first half of a side of the module cover 200, and the second opening 271b may be positioned in a second area or a second half of the side of the module cover 200. The first tilting hole 271a may be referred to as a first opening 271a. The second tilting hole 271b may be referred to as a second opening 271b. The first opening 271a may be located at a first area of the module cover 200. The first area of the module cover 200 may mean left half of the module cover 200. The second opening 271b may be located at a second area of the module cover 200. The second area of the module cover 200 may mean right half of the module cover 200. The left and right halves of the module cover 200 may mean two halves aligned horizontally.

The first and second fixing pins 511a and 511b fixed to the wall bracket 500 may be fastened to the first and second tilting holes 271a and 271b provided in the module cover 200, and may limit the movement of the module cover 200. The module cover 200 can be fixed by the shape of the tilting hole 271 into which the fixing pin 511 is drawn. This means that movement in at least one direction of the module cover 200 can be restricted corresponding to the shape of the tilting hole 271. The module cover 200 can be guided along the shape of the tilting hole 271 into which the fixing pin 511 is inserted. This means that the module cover 200 can be tilted or shifted in a predetermined direction corresponding to the shape of the tilting hole 271.

Figure 12:
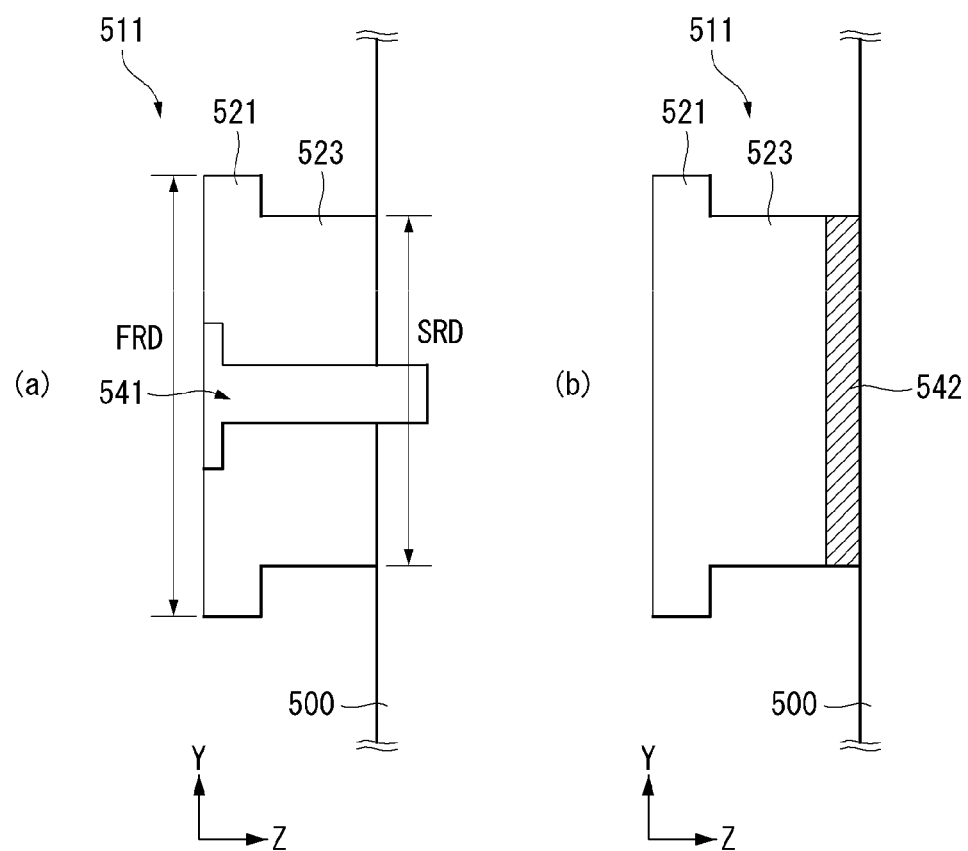
Figure 13:
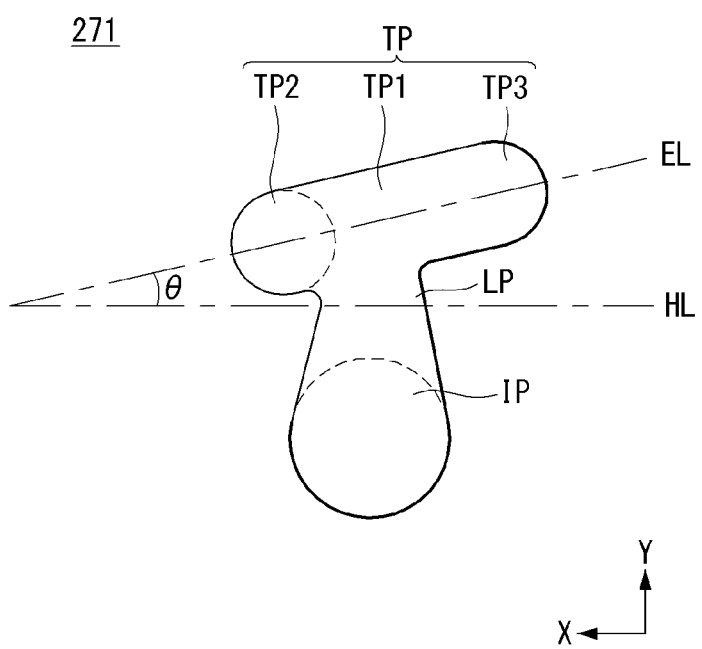
Figure 15:
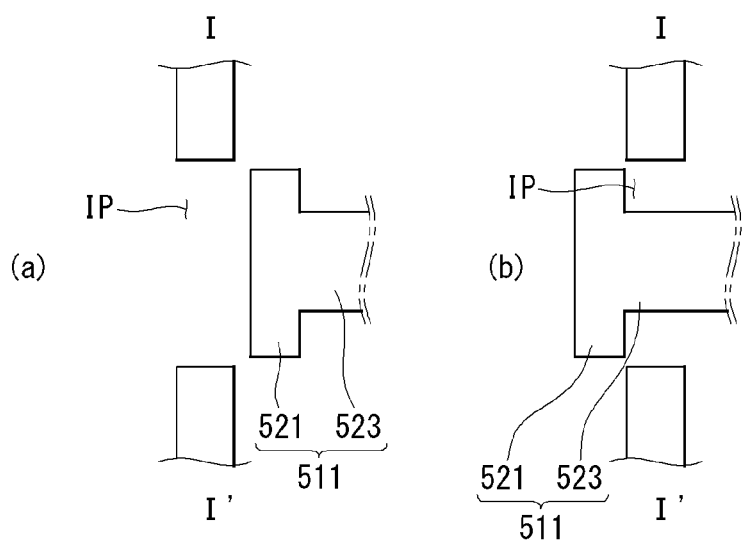
Figure 16:
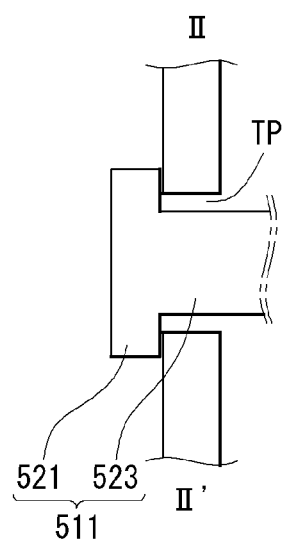

Referring to FIG. 12, the fixing pin 511 may include a pin head 521 and a pin neck 523. The pin head 521 and the pin neck 523 may have a cylindrical shape with different diameters. For example, the pin head 521 has a cylindrical shape with a first diameter FRD and the pin neck 523 has a cylindrical shape that extends from the pin head 521 and a second diameter SRD of the cylindrical shape of the pin neck 523 is smaller than the first diameter FRD. As fixing pin 511 includes the pin head 521 and the pin neck 523 having different diameters, the fixing pin 511 can be easily fastened to at least one side of the tilting hole 271.

The fixing pin 511 can be coupled to the wall bracket 500 by fastening a screw to at least one hole 541 of the fixing pin 511. In that case, the fixing pin 511 and the wall bracket 500 can be strongly coupled to each other (FIG. 12 (a)). Alternatively, the fixing pin 511 can be fixed to the wall bracket 500 by the adhesive sheet 542. When bonding is performed using the adhesive sheet 542, the cost can be saved as compared with the case of bonding using another method (FIG. 12 (b)). The bonding methods of the fixing pin 511 and the wall bracket 500 are not limited thereto, and the fixing pin 511 and the wall bracket 500 may be coupled through various methods such as Velcro or welding.

Referring to FIGS. 13 to 16, the tilting hole 271 may include an insertion portion IP and a guide portion TP.

The insertion portion IP may be a portion where the fixing pin 511 is drawn in and drawn out. That is, the insertion portion IP can have a sufficient hole area that both the pin head 521 and the pin neck 523 can be drawn in and out. The insertion portion IP may have a larger hole area than the first diameter FRD of the pin head 521. In the insertion portion IP, the movement of the pin head 521 and the pin neck 523 in the direction of backward and forward may not be restricted. In other words, the pin head 521 may be located within the boundary of the insertion portion IP. The boundary of the insertion portion IP may refer to the outskirt of the insertion portion IP. Accordingly, the pin head 521 can be drawn in and out from the tilting hole 271 at the insertion portion IP. The insertion portion IP may have various planar shapes such as a rectangle, a square, and an ellipse.

The guide portion TP may include a seating portion TP1 and first and second extending portions TP2 and TP3 extended from the seating portion TP1. The first extending portion TP2 and the second extending portion TP3 may extend in the reverse directions with respect to the seating portion TP1. The extension line EL extending from the first extension portion TP2 to second extension portion TP3 and the horizontal line HL extending in the horizontal direction cross each other. The horizontal line HL may be referred to as a horizontal axis HL. The guide portion TP may be elongated along the extension line EL. That is, the guide portion TP may be an elongated portion of the opening 271. The angle between the extension line EL and the horizontal line HE may be a tilting angle. The tilting angle may represent an angle of tilt, neither vertical nor horizontal. For example, the acute angle $\theta$ formed by the extension line EL and the horizontal line HL may be from 5 degree to 30 degree. The horizontal line may be referred to as a horizontal axis.

The guide portion TP may be a portion where the fixing pin 511 is fixed in the tilting hole 271. For example, the seating portion TP1 included in the guide portion TP may be a portion where the fixing pin 511 seats in the tilting hole 271 initially, wherein the fixing pin 511 relatively moves along the shape of the tilting hole 271 due to the movement of the module cover 200. The fixing pin 511 seated in the seating portion TP1 can maintain the current state unless an external force equal to or greater than a predetermined value is provided. That is, as long as a predetermined external force is not provided, the fixing pin 511 can be positioned in the seating portion TP1.

In other words, when a predetermined external force is applied, the module cover 200 can be tilted in a direction, and the fixing pin 511 can be relatively moved along the guide portion TP. The relative movement of the fixing pin 511 can be guided along the shape of the guide portion TP. "The fixing pin 511 moves relatively" means that the movement of the fixing pin 511 fixed to the wall bracket 500 is restrained but the fixing pin 511 is moved in the tilting hole 271 in response to the movement of the module cover 200.

Referring to FIG. 14 (a), the fixing pin 511 may be inserted into the insertion portion IP. The fixing pin 511 may be positioned at an inlet point Pi when the fixing pin 511 is fitted in the insertion portion IP. The inlet point Pi may be referred to as an initial point Pi. The initial point Pi may be positioned under the guide portion TP.

Referring to FIG. 14 (b), the fixing pin 511 may move in the link portion LP. The fixing pin 511 may move from the initial point Pi to a transient point Pt. The transient point Pt may stand for a border between the link portion LP and the guide portion TP. The transient point Pt may be higher than initial point Pi as much as a first height H1. The fixing pin 511 may move as much as the first height H1 in the link portion LP. The width of the link portion LP may get narrower from the initial point Pi to transient point Pt.

Referring to FIG. 14 (c), the fixing pin 511 may move upward. The fixing pin 511 may move from the transient point Pt to a final point Pf. The fixing pin 511 may be positioned at final point Pf when the fixing pin 511 is accommodated in the seating portion TP1. The final point Pf may be higher than the transient point Pt as much as a second height H2. The final point Pf may be higher than the initial point Pi as much as a third height H3. The fixing pin 511 may move in the guide portion TP. The fixing pin 511 may move in both directions. The both direction may be illustrated as an arrow in FIG. 14 (c). The link portion LP may be extended from a first side to a second side. The first side of the link portion LP may be located near the insertion portion IP. The second side of the link portion LP may be located near the guide portion TP. The first side of the link portion LP may be a side of the link portion toward the initial point Pi. The second side of the link portion LP may be another side of the link portion toward the transient point Pt.

Referring to FIG. 14 (d), the fixing pin 511 may move toward a left point Pl of the guide portion TP or a right point Pr of the guide portion TP. The left point Pl of the guide portion TP may be referred to as a first end Pl of the guide portion TP. The first end Pl may be a first distance D1 away from the final point Pf. The right point Pr of the guide portion TP may be referred to as a second end Pr of the guide portion TP. The second end Pr may be a second distance D2 away from the final point Pf. The first end Pl may stand for a point that the fixing pin 511 can approach in left direction. The second end Pr may stand for a point that the fixing pin 511 can approach in right direction.

The first end Pl may be away from the final point Pf horizontally or vertically. The first end Pl may be away from the final point Pf in both horizontal and vertical directions. The second end Pr may away from the final point Pf in both horizontal and vertical directions.

The guide portion TP may have a hole area in which the pin head 521 cannot enter or be drawn out. That is, the guide portion TP may have a smaller hole area than the first diameter FRD of the pin head 521. The pin head 521 pulled in the front direction of the module cover 200 through the insertion portion IP can be restrained from moving in the guide portion TP in the rear direction. In other words, a portion of the pin head 521 or the periphery of the pin head 521 may be located outside the boundary of the guide portion TP, and the pin neck 523 may be located inside the boundary of the guide portion TP. The boundary of the guide portion TP may mean the outer edge of the guide portion TP. As a result, the pin head 521 is restricted from being pulled in and out of the tilting hole 271 in the guide portion TP.

Accordingly, the fixing pin 511 may not be separated from the guide portion TP. The guide portion TP may have a hole area through which the pin neck 523 can pass. That is, the guide portion TP may have a hole area greater than the second diameter SRD of the pin neck 523.

The tilting hole 271 may further include a link portion LP connecting the insertion portion IP and the guide portion TP. The link portion LP can function as a path of the fixing pin 511 moving between the insertion portion IP and the guide portion TP. That is, the link portion LP can be a path in which the fixing pin 511 drawn through the insertion portion IP moves to the guide portion TP, so that the fixing pin 511 can be seated in the tilting hole 271. The link portion LP can be a path in which the fixing pin 511 seated in the guide portion TP moves to the insertion portion IP, so that the fixing pin 511 can be separated from the tilting hole 271. As the tilting hole 271 includes the link portion LP, a sufficient movement path of the fixing pin 511 can be secured. This can prevent the detachment of the fixing pin 511 seated on the guide portion TP from the tilting hole 271 due to the unintentional external force.

The link portion LP may have a hole area in which the pin head 521 cannot be drawn in and drawn out. That is, the link portion LP may have a smaller hole area than the first diameter FRD of the pin head 521. Accordingly, the pin head 521 pulled in the front direction of the module cover 200 through the inlet IP is restrained from moving backward in the link portion LP. Accordingly, the fixing pin 511 may not be separated from the link portion LP. The link portion LP may have a hole area through which the pin neck 523 can pass. That is, the guide portion TP may have a hole area greater than the second diameter SRD of the pin neck 523. The hole area of the link portion LP may be different from the hole area of the guide portion TP.

The forming portion 280 may be positioned around at least one of the guide section TP and the link portion LP. The forming portion 280 may be provided at a position where the pin head 521 of the fixing pin 511 and the front surface of the module cover 200 face each other. The forming portion 280 may be provided along the shape of the guide portion TP and/or the shape of the link portion LP. The forming portion 280 may be formed on the module cover 200 and may have a shape protruding in the front direction with respect to the peripheral area. Accordingly, the pin head 521 of the fixing pin 511 drawn through the insertion portion IP can easily contact the forming portion 280, thereby restricting the movement of the module cover 200.

The tilting unit may include a fixing pin 511 and a tilting hole 271. The tilting unit can be positioned between the module cover 200 and the wall bracket 500. The fixing pin 511 may be formed on the module cover 200 or the wall bracket 500. The tilting hole 271 may be formed on the wall bracket 500 or the module cover 200.

Figure 17:
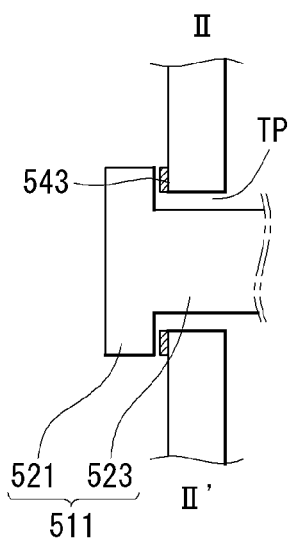

Referring to FIG. 17, a friction member 543 may be further provided around at least one of the guide portion TP and the link portion LP (referring to FIG. 14). The friction member 543 may be provided on the module cover 200 at a position where the pin head 521 of the fixing pin 511 and the front surface of the module cover 200 are in contact or face each other. The friction member 543 may be provided on the forming portion 280 when the forming portion 280 is located in at least one of the guide portion TP and the link portion LP (referring to FIG. 14). The friction member 543 may be provided along the shape of the guide portion TP and/or the link portion LP. For example, the friction member 543 may be rubber silicone or the like.

The friction member 543 may provide a predetermined frictional force when the pin head 521 and the module cover 200 are in contact with each other to limit the movement of the module cover 200 in the up and down and left and right directions. The module cover 200 can maintain the current state unless a predetermined external force is applied thereto. By further including the friction member 543, it is possible to prevent the module cover 200 from being unintentionally tilted or shifted, and to prevent the module cover 200 from being separated from the wall bracket 500.

Hereinafter, the positional relationship and shape of the pair of first fixing pin 511a and second fixing pin 511b will be described in detail with reference to FIGS. 18 to 20.

Figure 18:
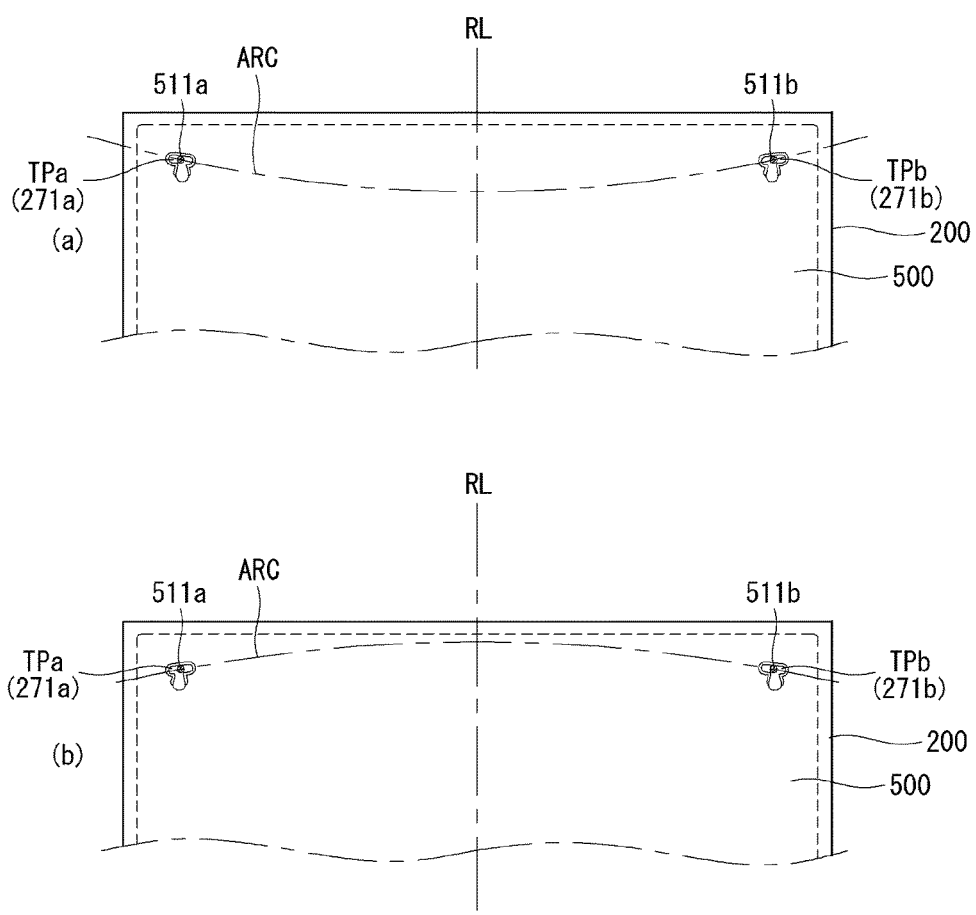
FIGS. 18 to 20 are views showing examples of a pair of first fixing pins and second fixing pins according to an embodiment of the present invention.

Referring to FIG. 18, the wall bracket 500 may include at least a pair of a first fixing pin 511a and a second fixing pin 511b. The module cover 200 may include at least a pair of a first tilting hole 271a and a second tilting hole 271b.

The first fixing pin 511a may be provided at a position corresponding to the first tilting hole 271a and can be inserted into the first tilting hole 271a. The module cover 200 having the first tilting hole 271a can be movably fastened to the wall bracket 500 having the first fixing pin 511a. The second fixing pin 511b may be provided at a position corresponding to the second tilting hole 271b and can be inserted into the second tilting hole 271b. The module cover 200 having the second tilting hole 271b can be movably fastened to the wall bracket 500 having the second fixing pin 511b.

The module cover 200 fastened to the wall bracket 500 can be tilted in a predetermined direction. However, unless the predetermined external force is applied, the module cover 200 can be fastened to the wall bracket 500 to maintain the current state (or fixed state). The predetermined direction may be determined according to the positions and shapes of the first tilting hole 271a and the second tilting hole 271b. Particularly, the predetermined direction may be determined according to the guide portion TP of the first tilting hole 271a (hereinafter referred to as "first guide portion TPa") and the guide portion TP of the second tilting hole 271b (hereinafter referred to as "second guide portion TPb"). The guide portion TP may mean at least one of the first guide portion TPa and the second guide portion TPb.

The first guide portion TPa and the second guide portion TPb may be located on a line of a virtual arc ARC. The virtual arc ARC may be a virtual curved line connecting the center of the first guide portion TPa and the center of the second guide portion TPb. The virtual arc ARC may have a downward convex curved shape (FIG. 18A) or an upward convex curved shape (FIG. 18B).

For example, the center of the first guide portion TPa and the center of the second guide portion TPb may be located on the left and right sides of the module cover 200 respectively on the line of the virtual arc ARC. The virtual arc ARC can be an arc that is a part of a circle having a virtual center point. The virtual center point may be located on a virtual reference line RL that crosses the center of the module cover 200 in the up and down direction. The curvature of the virtual arc ARC may vary depending on the position of the virtual center point on the virtual reference line RL. The first guide portion TPa may have a center axis. The center axis of the first guide portion TPa may be a first center axis. The second guide portion TPb may have a center axis. The center axis of the second guide portion TPb may be a second center axis. The first center axis and the second center axis may be tangential to the virtual arc ARC. The virtual arc ARC may be referred to as a 'shared arc'. The shared arc ARC may be a portion of a circle of which center is located above the first opening 271a and the second opening 271b.

The center of the first guide portion TPa located on the virtual arc ARC may correspond to the center of the first fixing pin 511a fixed to the wall bracket 500. In particular, the center of the first guide portion TPa located on the virtual arc ARC may correspond to the center of the pin neck 523 of the first fixing pin 511a. When the first fixing pin 511a has a cylindrical shape, the center of the first fixing pin 511a may be the center of a circle.

The center of the second guide portion TPb located on the virtual arc ARC may correspond to the center of the second fixing pin 511b fixed to the wall bracket 500. In particular, the center of the second guide portion TPb located on the virtual arc ARC may correspond to the center of the pin neck 523 of the second fixing pin 511b. When the second fixing pin 511b has a cylindrical shape, the center of the second fixing pin 511b may be the center of a circle.

Figure 19:
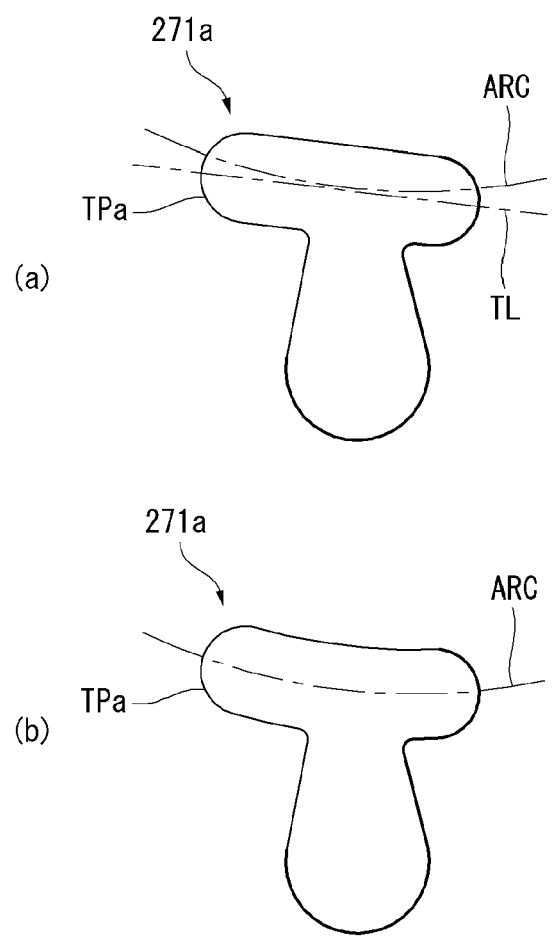

Referring to FIG. 19 (a), the extending direction of the first guide portion TPa may be the direction in which the tangential line TL of the virtual arc ARC passing through the center of the first and second guide portions TPa and TPb (referring to FIG. 18) advances. A center axis of the first guide portion TPa, may be in the extending direction of the first guide portion TPa. The extending direction of the second guide portion TPb (referring to FIG. 18) which forms a pair with the first guide portion TPa, may be the direction in which the tangential line TL of the virtual arc ARC passing through the center of the first and second guide portions TPa and TPb (referring to FIG. 18) advances.

Referring to FIG. 19 (b), the extending direction of the first guide portion TPa may be the direction in which the virtual arc ARC passing through the center of the first and second guide portions TPa and TPb (referring to FIG. 18) advances. The extending direction of the second guide portion TPb (referring to FIG. 18) which forms a pair with the first guide portion TPa, may be the direction in which the virtual arc ARC passing through the center of the first and second guide portions TPa and TPb (referring to FIG. 18) advances. In this case, the first guide portion TPa and the second guide portion TPb (referring to FIG. 18) may have a curved shape.

Figure 20:
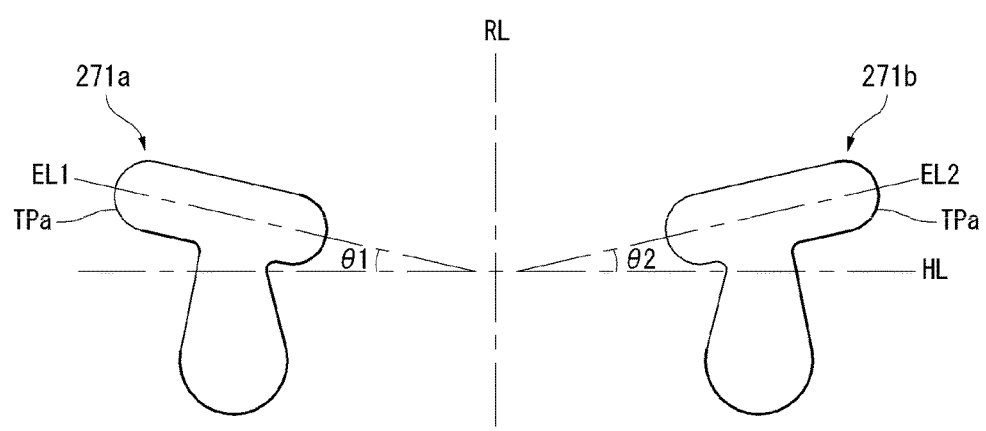

Referring to FIG. 20, the first tilting hole 271a and the second tilting hole 271b may have a symmetrical shape. For example, the first tilting hole 271a and the second tilting hole 271b may be respectively positioned on the left and right sides of the module cover 200 so as to be symmetrical with respect to the virtual reference line RL. The virtual reference line RL, may be an virtual straight line crossing the center of the module cover 200 in the up and down direction.

A first angle θ1 is formed between a first extending line EL1 extending in the extending direction of the first guide portion TPa and a horizontal line HL. The horizontal line HL advances in the horizontal direction. A second angle θ2 is formed between a second extending line EL2 extending in the extending direction of the second guide portion TPb and the horizontal line HL. The symmetric configuration of the first guide portion TPa and the second guide portion TPb may mean that the first angle ƒ1 is identical to the second angle θ2.

Hereinafter, an operation of fastening the module cover 200 to the wall bracket 500 fixed to the attachment surface 700 will be described with reference to FIGS. 21 to 24.

Figure 21:
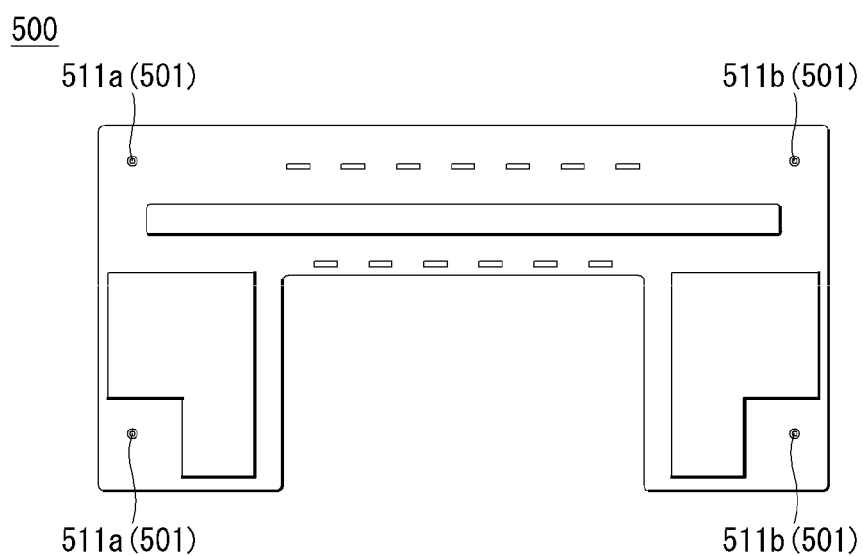
FIGS. 21 to 24 are views showing examples of a process of fastening a module cover to a wall bracket according to an embodiment of the present invention.

Referring to FIG. 21, the wall bracket 500 may be secured in a selected position of the fixture. The wall bracket 500 can be fixed to the attachment surface of the fixture using a fixing member 501 such as a screw. The fixing member 501 may be provided at a suitable position so as to constrain the swinging, tilting, and twisting of the wall bracket 500 in any one direction.

The wall bracket 500 may include at least a pair of a first fixing pin 511a and a second fixing pin 511b protruding in the front direction. The fixing pins 511 may be provided at positions corresponding to the fixing member 501.

The fixing pins 511 may be inserted into tilting holes 271 (referring to FIG. 11) of the module cover 200 (referring to FIG. 11) to restrict movement of the module cover 200. The fixing pin 511 may be provided at a suitable position so as to restrain the swinging, tilting, and twisting of the module cover 200 in any one direction.

Figure 22:
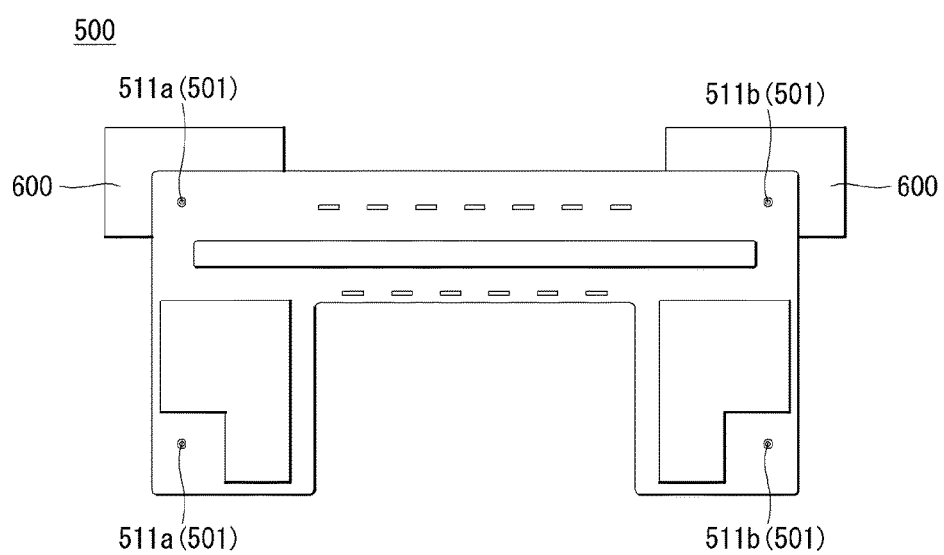

Referring to FIG. 22, a guide sheet 600 may be provided on at least one of both upper corners of the wall bracket 500 and both lower corners of the wall bracket 500. The guide sheet 600 can be positioned between the attachment surface 700 (referring to FIG. 9) and the wall bracket 500 and can be partially exposed to the outside of the wall bracket 500. The guide sheet 600 may guide the module cover 200 fastened to the wall bracket 500 to be positioned at a predetermined position.

The guide sheet 600 may include a guideline for determining the position of the module cover 200 (referring to FIG. 9). The guideline refers to the mark displayed at a position on the guide sheet 600 in consideration of the position of the module cover 200 to be fastened subsequently. The guiding line may be implemented as a mark having a concave portion and/or a convex portion so that the module cover 200 can be guided along the shape of the guiding line. However, the present invention is not limited to this, and may be embodied as a visual marking in which points, lines, and the like are marked.

Figure 23:
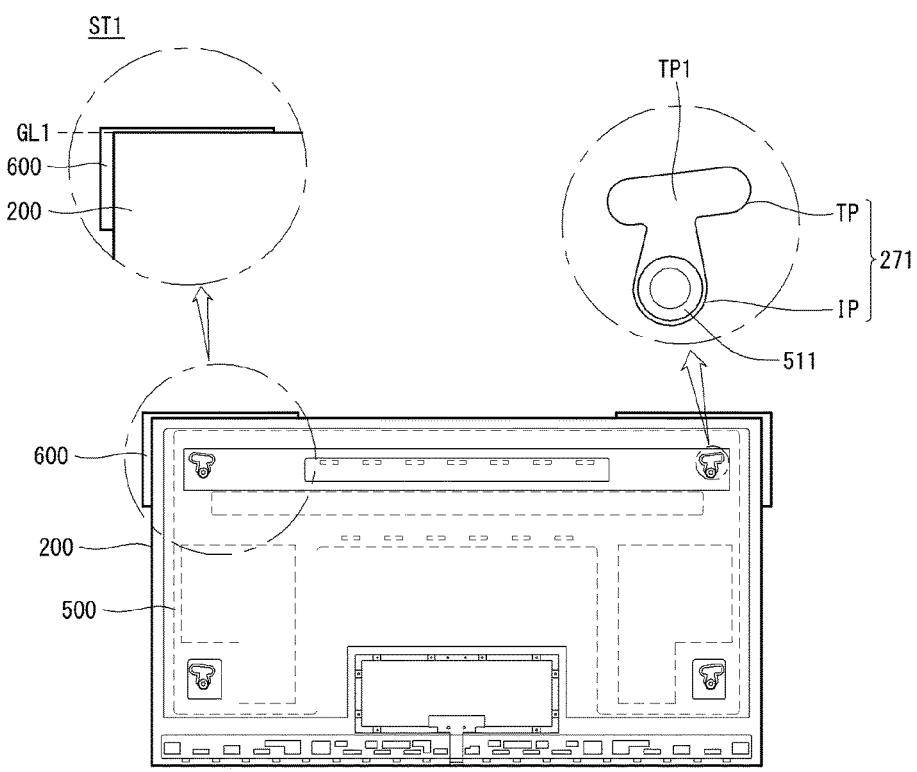

Referring to FIG. 23, the fixing pin 511 of the wall bracket 500 can be inserted into the insertion portion IP of the tilting hole 271 of the module cover 200. The module cover 200 can be positioned on the first guide line GL1 of the guide sheet 600 in the first state ST1 in which the fixing pin 511 is drawn into the insertion portion IP.

Figure 24:
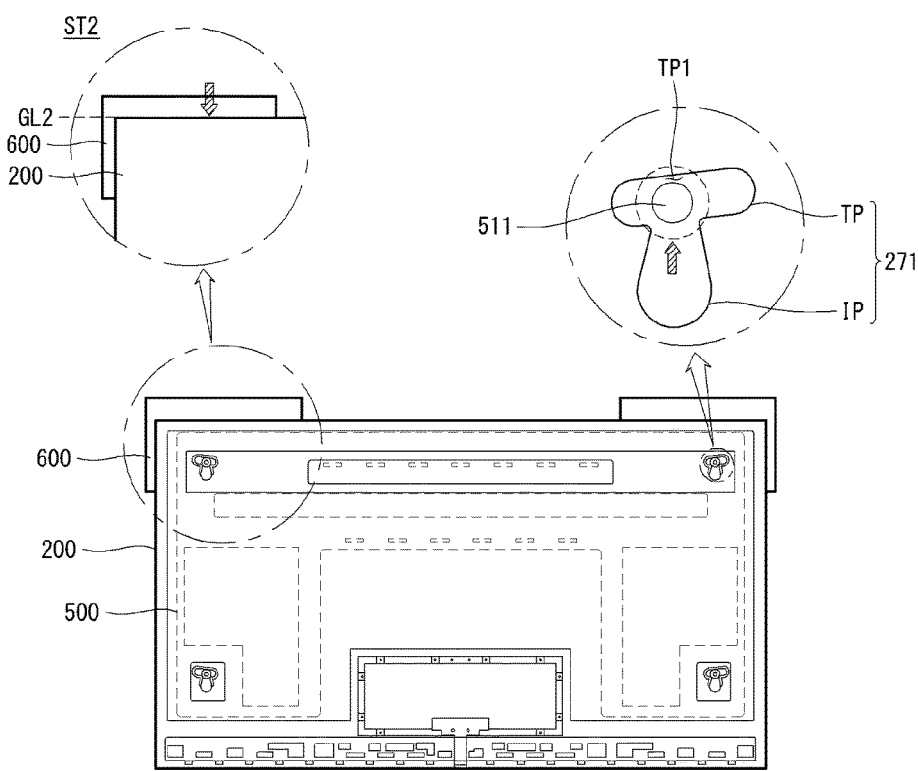

Referring to FIG. 24, the module cover 200 moves downward and the fixing pin 511 can move toward the guide portion TP from the insertion portion IP in response to the movement of the module cover 200. The fixing pin 511 may be seated in the guide portion TP so that the module cover 200 can be secured to the wall bracket 500. The module cover 200 can maintain the fixed state unless a predetermined external force is applied thereto.

In the second state ST2 in which the fixing pin 511 is seated in the guide portion TP, the module cover 200 can be positioned on the second guide line GL2 of the guide sheet 600. Through the second guide line GL2, it can be confirmed whether or not the module cover 200 is correctly aligned at a desired position.

Hereinafter, the tilting operation for aligning the module cover 200 will be described in detail with reference to FIGS. 25 to 27.

The module cover 200 is fastened to the wall bracket 500 to maintain a limited movement. The first fixing pin 511a of the wall bracket 500 may be inserted into the first tilting hole 271a of the module cover 200 and may be mounted in the seating portion TP1 of the first guide portion TPa. The second fixing pin 511b of the wall bracket 500 may be inserted into the second tilting hole 271b of the module cover 200 and can be mounted in the seating portion TP1 of the second guide portion TPb.

While the movement of the module cover 200 is restricted, the user can move the module cover 200 from the current position to a desired position by tilting the module cover 200 (or by applying a predetermined external force).

Figure 25:
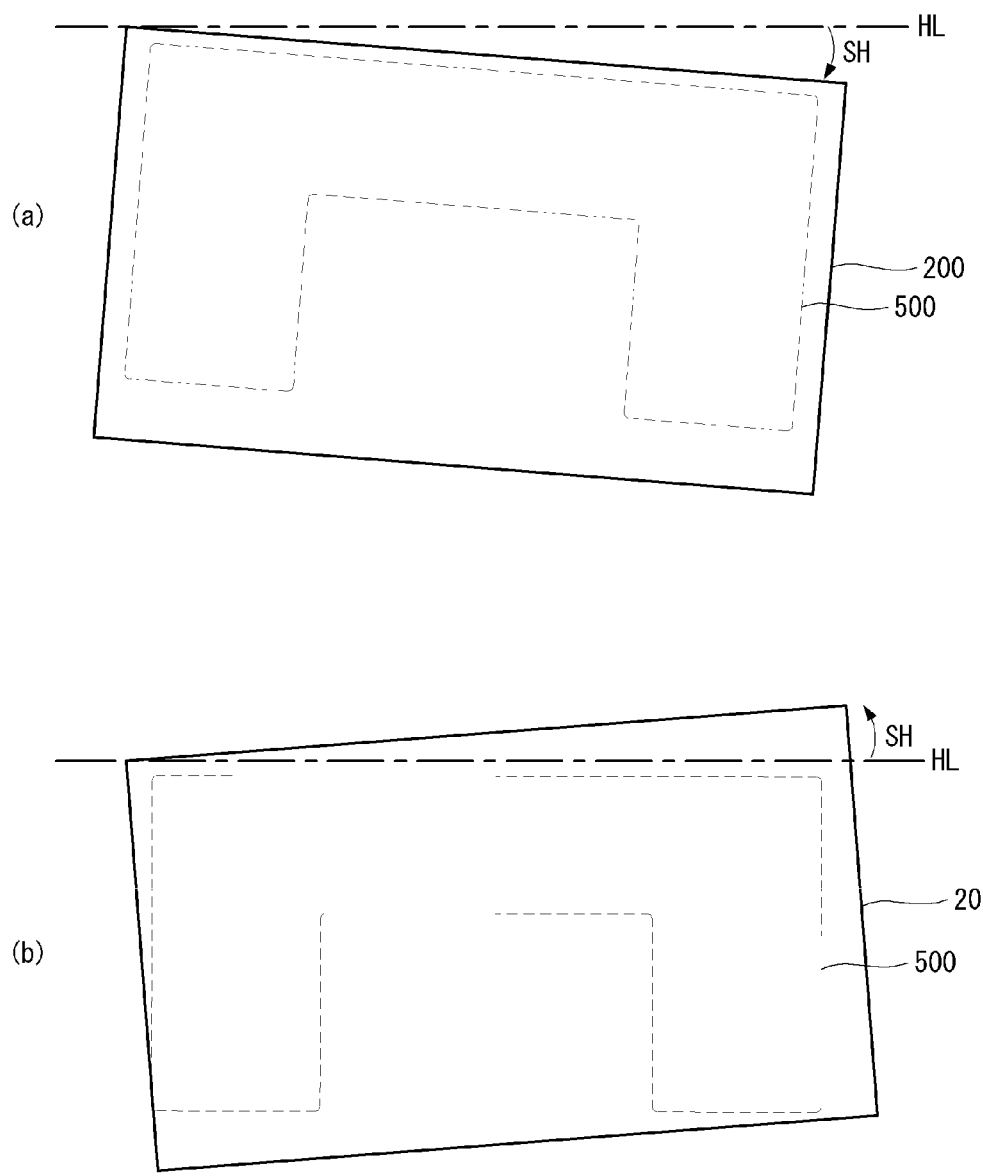
FIGS. 25 to 27 are views showing examples of a process of aligning a module cover to a desired position according to an embodiment of the present invention.

Referring to FIG. 25, the module cover 200 fixed at a specific position may not be positioned horizontally. For example, referring to FIG. 25 (a), the wall bracket 500 fixed to the attachment surface 700 (referring to FIG. 9) is not aligned horizontally, so that the module cover 200 fastened to the wall bracket 500 may be positioned not to be horizontal. In this case, it is necessary to correct the module cover 200 to horizontal level by tilting the module cover 200. For another example, referring to FIG. 25 (b), the wall bracket 500 may be positioned horizontally but the module cover 200 fastened to the wall bracket 500 may not be aligned horizontally. In this case, it is necessary to correct the module cover 200 to horizontally by tilting the module cover 200.

Figure 26:
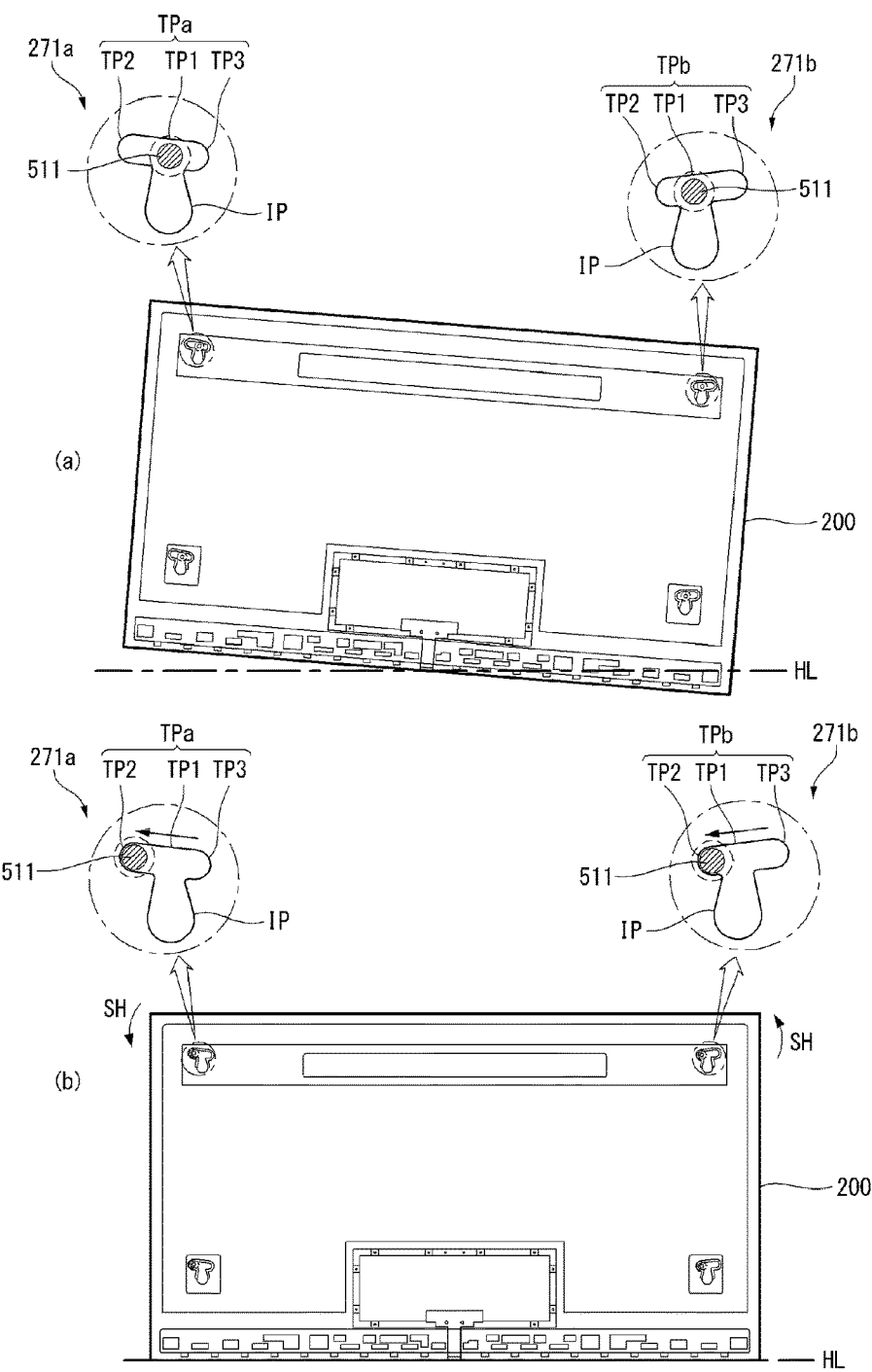

Referring to FIG. 26, the present state in which the movement of the module cover 200 is restricted, may be a state in which the module cover 200 is not positioned horizontally, the left side of the module cover 200 is inclined upward relative to the horizontal line HL, and the right side of the module cover 200 is inclined downward relative to the horizontal line HL. In this case, the user can perform the tilting operation to position the module cover 200 horizontally.

That is, in order to align the module cover 200 horizontally, the user may shift the left side of the module cover 200 downward and shift the right side of the module cover 200 upward. The tilting operation may be performed by the shift SH. As the left side of the module cover 200 is shifted downward, the first fixing pin 511a may move along the inclination of the first guide portion TPa toward the first extending portion TP2 of the first guide portion TPa. As the right side of the module cover 200 is shifted upward, the second fixing pin 511b may move along the inclination of the second guide portion TPb toward the first extending portion TP2 of the second fixing pin TPb.

Figure 27:
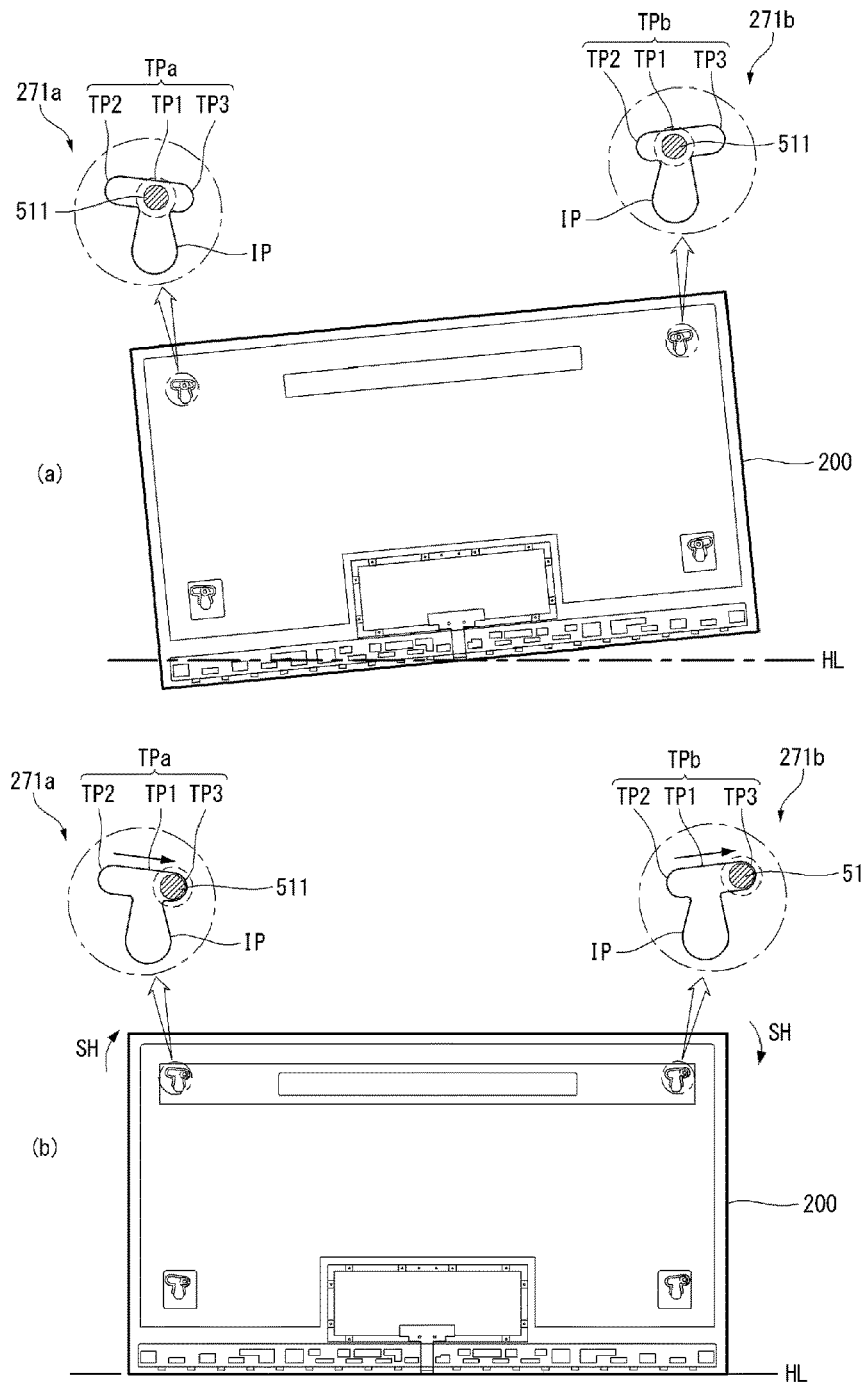

Referring to FIG. 27, the present state in which the movement of the module cover 200 is restricted, may be a state in which the module cover 200 is not positioned horizontally, the left side of the module cover 200 is inclined downward relative to the horizontal line HL, and the right side of the module cover 200 is inclined upward relative to the horizontal line HL. In this case, the user can perform the tilting operation to position the module cover 200 horizontally.

That is, in order to align the module cover 200 horizontally, the user may shift the left side of the module cover 200 upward and shift the right side of the module cover 200 downward. The tilting operation may be performed by the shift SH. As the left side of the module cover 200 is shifted upward, the first fixing pin 511a may move along the inclination of the first guide portion TPa toward the second extending portion TP3 of the first guide portion TPa. As the right side of the module cover 200 is shifted downward, the second fixing pin 511b may move along the inclination of the second guide portion TPb toward the second extending portion TP3 of the second fixing pin TPb.

According to at least one embodiment of the present invention, it is not necessary to detach the module cover 200 from the wall bracket 500 to adjust the position of the module cover 200. That is, according to at least one embodiment of the present invention, there is an advantage that the horizontal level of the module cover 200 can be easily adjusted only by a simple tilting operation.

According to at least one embodiment of the present invention, there is an advantage that the position of the module cover 200 can be finely adjusted along the shape of the tilting hole 271. According to at least one embodiment of the present invention, the position of the module cover 200 can be adjusted only by a simple tilting operation, thereby providing a display device with improved user convenience.

Hereinafter, the operation of separating the module cover 200 from the wall bracket 500 will be described with reference to FIGS. 28 to 30.

The module cover 200 can be easily separated from the wall bracket 500.

Figure 28:
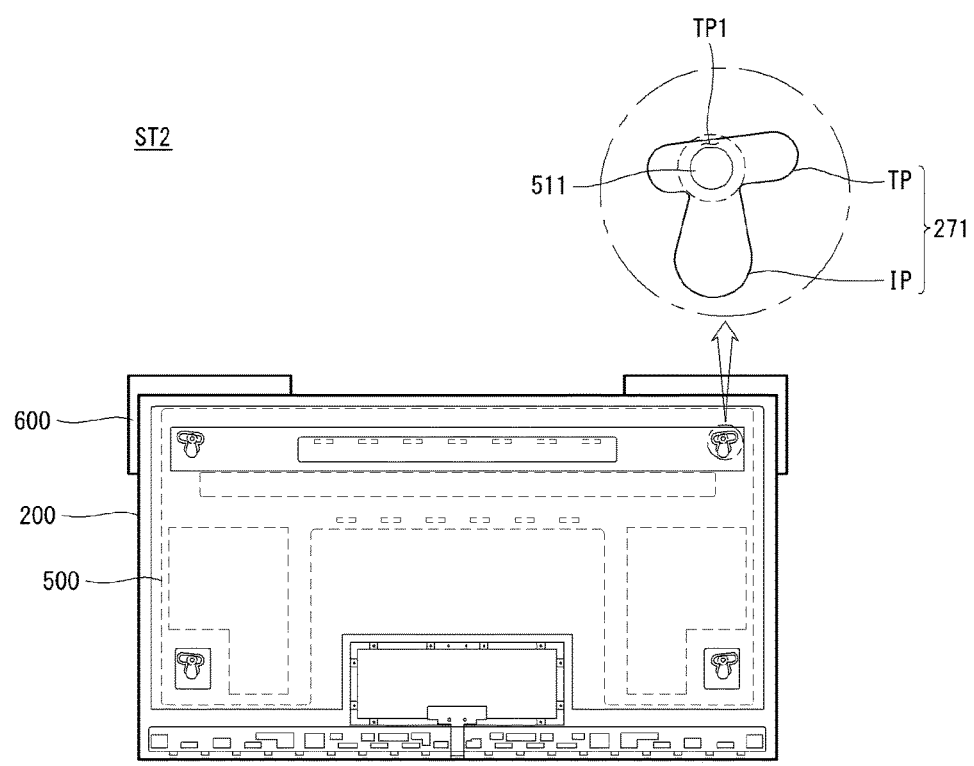
FIGS. 28 to 30 are views illustrating examples of a process of separating a module cover from a wall bracket according to an embodiment of the present invention.

Referring to FIG. 28, the module cover 200 may maintain the current state in which the module cover 200 is fixed to the wall bracket 500, unless a predetermined external force is applied thereto. The fixing pin 511 maintains the second state ST2 in which the fixing pin 511 is seated in the guide portion TP of the tilting hole 271.

Figure 29:
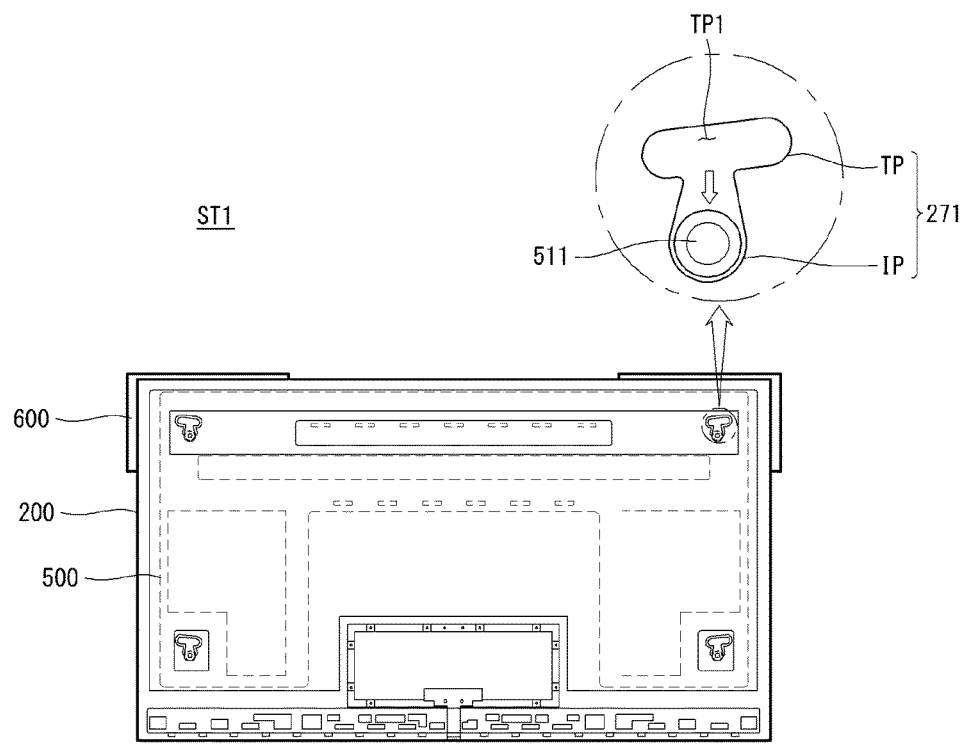

Referring to FIG. 29, in order to detach the module cover 200 from the wall bracket 500, a predetermined external force may be applied to the module cover 200. By the applied external force, the module cover 200 may be moved upward and the fixing pin 511 may be relatively moved toward the insertion portion IP from the guide portion TP in accordance with the movement of the module cover 200. The fixing pin 511 can be drawn out from the insertion portion IP of the tilting hole 271 in the first state ST1 in which the fixing pin 511 is positioned at the insertion portion IP of the tilting hole 271. That is, the first state ST1 indicates a state in which the module cover 200 can be separated from the wall bracket 500.

Figure 30:
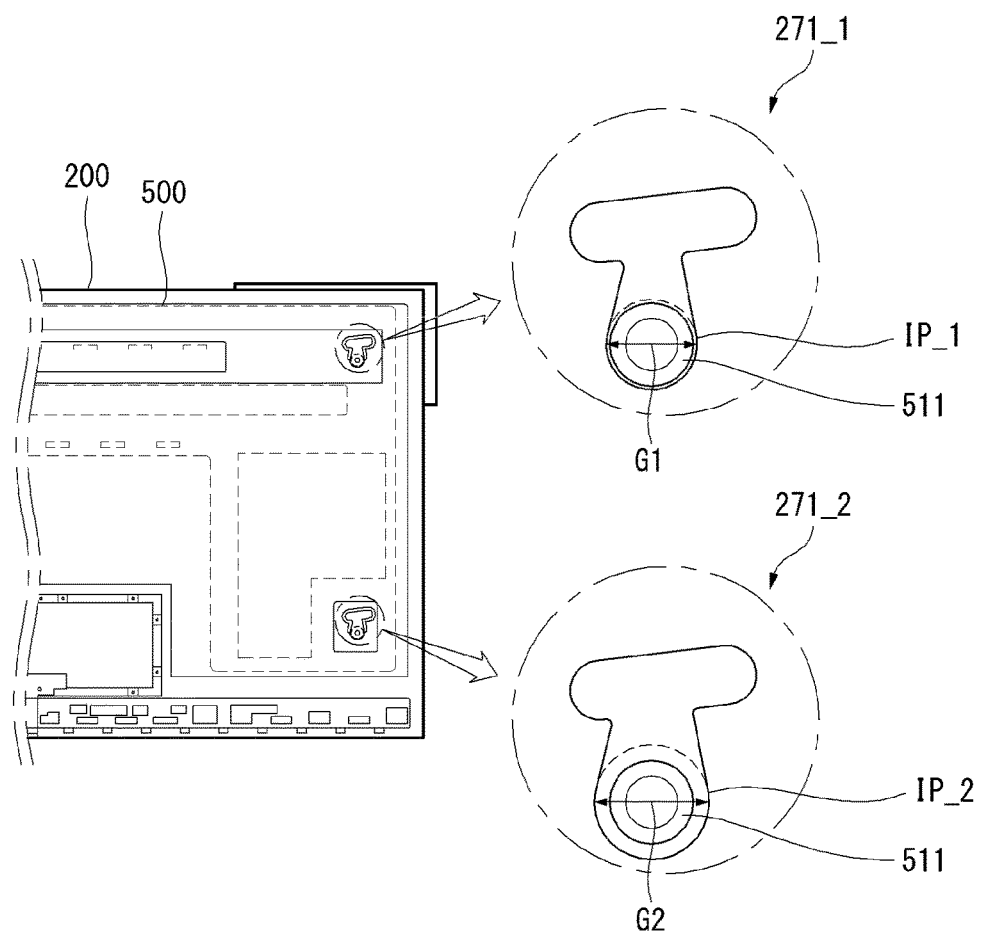

Referring to FIG. 30, the tilting hole 271 may include an upper tilting hole 271_1 and a lower tilting hole 271_2. The lower tilting hole 271_2 is provided below the upper tilting hole 271_1. The insertion portion IP_1 of the upper tilting hole 271_1 may have a circular shape having a first diameter G1. The insertion portion IP_2 of the lower tilting hole 271_2 may have a circular shape having a second diameter G2. The second diameter G2 may be equal to or greater than the first diameter G1. There is an advantage that the module cover 200 can be easily separated from the wall bracket 500 when the insertion portion IP_2 of the lower tilting hole 271_2 has a diameter greater than a diameter of the insertion portion IP_1 of the upper tilting hole 271_1.

Figure 31:
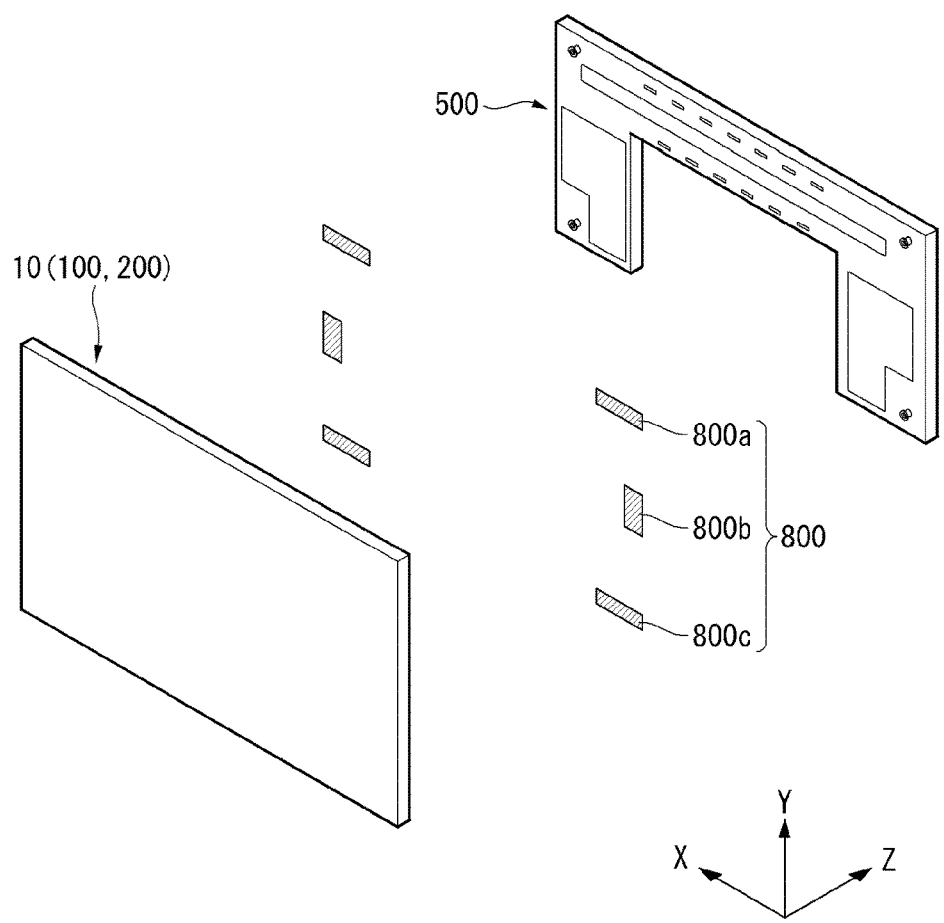
FIGS. 31 and 32 are views showing an example of fastening the head unit and the wall bracket according to an embodiment of the present invention.
Figure 32:
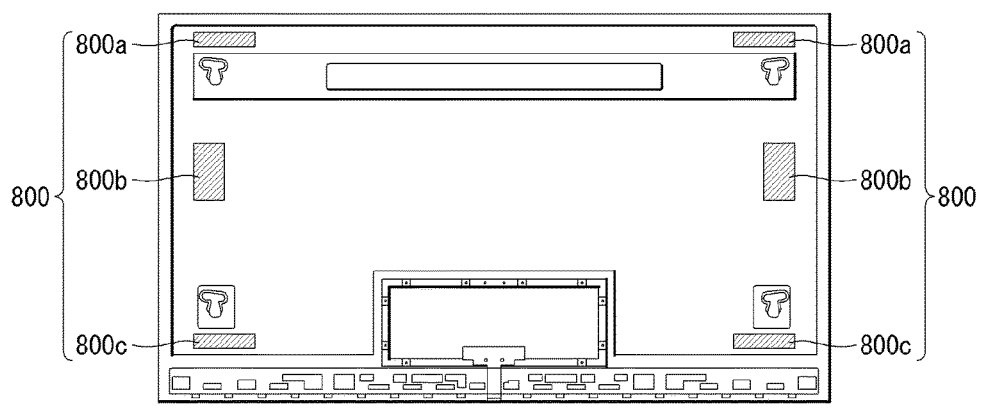

FIG. 31 and FIG. 32 are views showing an example of fastening the head portion 10 and the wall bracket 500 according to an embodiment of the present invention.

Referring to FIGS. 31 and 32, a coupling portion 800 may be positioned between the head portion 10 and the wall bracket 500. The coupling portion 800 may include a magnetic material. The coupling portion 800 can help the head portion 10 and the wall bracket 500 to be tightly joined together by magnetic force when they are fastened together.

The coupling portion 800 may be fixed to the head portion 10 to restrict movement. The coupling portion 800 fixed to the head portion 10 can be slidably contacted to the wall bracket 500 by the attractive force between the coupling portion 800 and the wall bracket 500. For this purpose, the wall bracket 500 may include a metal material. For example, the wall bracket 500 may include an aluminum material.

The head portion 10 and the wall bracket 500 can be closely attached to each other by the magnetic force of the coupling portion 800 and can be more firmly fastened. The tilting operation for aligning the head portion 10 is not limited by the magnetic force of the coupling portion 800 because the coupling portion 800 is slidably in contact with the wall bracket 500. The degree of the magnetic force of the coupling portion 800 can be appropriately selected within a range that does not restrict the tilting operation.

The coupling portion 800 may be formed as one body corresponding to the shape of the wall bracket 500. However, the present invention is not limited thereto, and the coupling portion 800 may be divided into a plurality of parts. When the parts of the coupling portion 800 are separately disposed, it is easy to manufacture, install and replace the coupling portion 800.

The coupling portion 800 may be divided into a plurality of coupling portions 800, and each of the coupling portions 800 may have different magnetic forces depending on the positions thereof That is, at least one of the separated coupling portions 800 may have a different magnetic force from at least one other.

The coupling portion 800 may include a first coupling portion 800*a*, a second coupling portion 800*c*, and a third coupling portion 800*b*. The first coupling portion 800*a* refers to the coupling portion 800 positioned on the upper side of the head portion 10. The second coupling portion 800*c* refers to the coupling portion 800 located on the lower side of the head portion 10. Either the first coupling portion 800*a* or the second coupling portion 800*c* may be omitted. The third coupling portion 800*b* refers to the coupling portion 800 positioned at the center of the head portion 10. The third coupling portion 800*b* may be positioned between the first coupling portion 800*a* and the second coupling portion 800*c*.

The user may apply a force to a lower portion of the head portion 10 to separate the head portion 10 from the wall bracket 500. Then, a central portion of the head portion 10 may not be separated from the wall bracket 500 due to the magnetic force of the third coupling portion 800*b*, and stress can be concentrated at the corresponding position. The stress may cause a crack in the display panel 100 constituting the head portion 10, which may cause image quality defects.

In order to prevent this, in the preferred embodiment of the present invention, the magnetic force of the third coupling portion 800*b* may be weaker than the magnetic force of the first and/or second coupling portion 800*a* and 800*c*. Accordingly, the preferred embodiment of the present invention can prevent the display panel 100 from cracking and ensure the reliability of the product.

Referring FIG. 33, the first guide portion TPa of the first opening 271*a* may be asymmetric with the second guide portion TPb of the second opening 271*b* with respect to the virtual reference line RL. For instance, referring FIG. 33 (*a*), the first guide portion TPa may be parallel to the horizontal axis, whereas the second guide portion TPb may be inclined with respect to the horizontal axis. The first guide portion TPa and the second guide portion TPb, may be positioned on a virtual arc ARC. The virtual arc ARC may be convex downward. A center point of the virtual arc ARC may be positioned left of the virtual reference line RL. For example, the center point of the virtual arc ARC, may be positioned above the first opening 271*a*. A location of the first opening 271*a* with respect to the horizontal axis, may be lower than a location of the second opening 271*b* with respect to the horizontal axis. The fixing pins 511*a*, 511*b* may be positioned in accordance with the openings 271*a*, 271*b*.

Referring FIG. 33 (b), the second guide portion TPb may be parallel to the horizontal axis, whereas the first guide portion TPa may be inclined with respect to the horizontal axis. The first guide portion TPa and the second guide portion TPb, may be positioned on a virtual arc ARC. The virtual arc ARC may be convex upward. A center point of the virtual arc ARC may be positioned right of the virtual reference line RL. For example, the center point of the virtual arc ARC, may be positioned above the second opening 271b. A location of the first opening 271a with respect to the horizontal axis, may be lower than a location of the second opening 271b with respect to the horizontal axis. The fixing pins 511a and 511b may be positioned in accordance with the openings 271a and 271b.

Referring to FIG. 33, one of the first guide portion TPa and the second guide portion TPb may be parallel to the horizontal axis, and the other may be inclined to the horizontal axis. In this case, the fixing pin 511a or 511b inserted in the guide portion TPa or TPb parallel to the horizontal axis may be seated in the guide portion TPa or TPb stably in comparison with the fixing pin 511a or 511b inserted in the guide portion TPa or TPb inclined to the horizontal axis.

Figure 34:
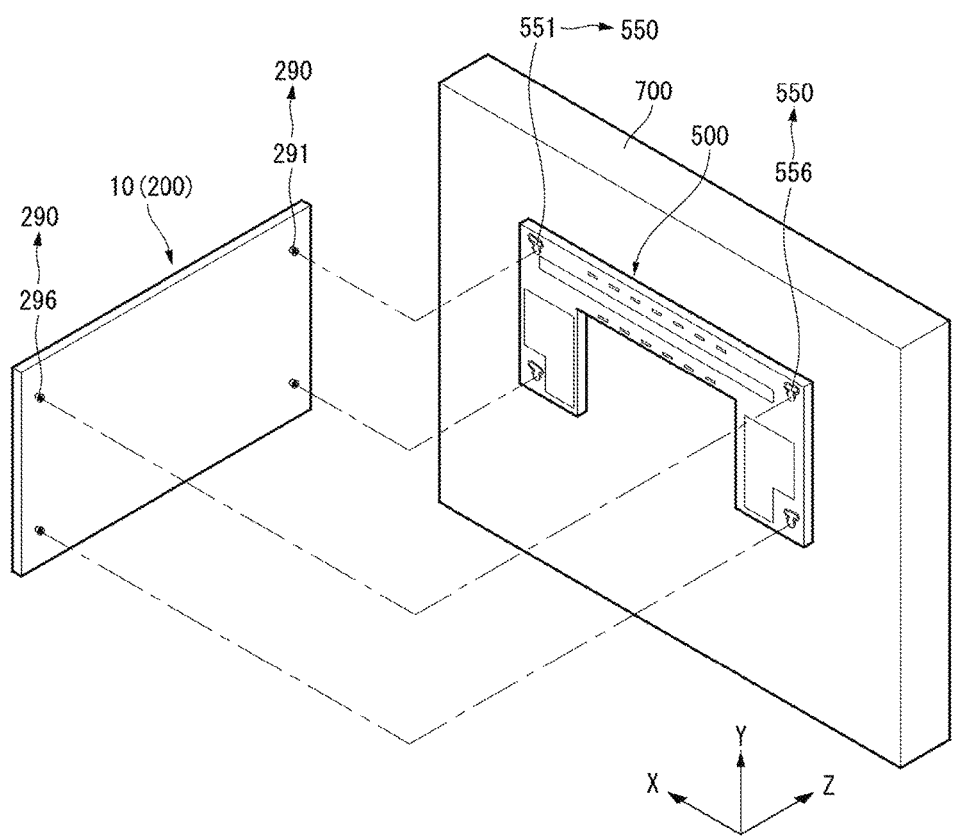

Referring to FIG. 34, the bracket 500 fixed to the attachment surface 700 may form an opening 550. The opening 550 formed in the bracket 500 may have a structure similar to the opening 271 shown in FIGS. 13 to 16. For example, the opening 550 formed in the bracket 500 may include a guide portion TP and a insertion portion IP. The opening 550 formed in the bracket 500 may include a link portion LP between the guide portion TP and the insertion portion IP, the link portion LP communicating with the insertion portion IP and the guide portion TP.

A fixing pin 290 may be installed on a rear surface of the module cover 200. The fixing pin 290 coupled to the module cover 200, may have a structure similar to the fixing pin 511 illustrated in FIG. 12. For example, the fixing pin mounted on the module cover 200, may include the pin head 521 and the pin neck 523. The fixing pin 290 formed on the rear of the module cover 200, may be fastened to the opening 550 formed at the bracket 500. For example, a first fixing pin 291 may be coupled with a first opening 551. For example, a second fixing pin 296 may be connected to a second opening 556.

Figure 35:
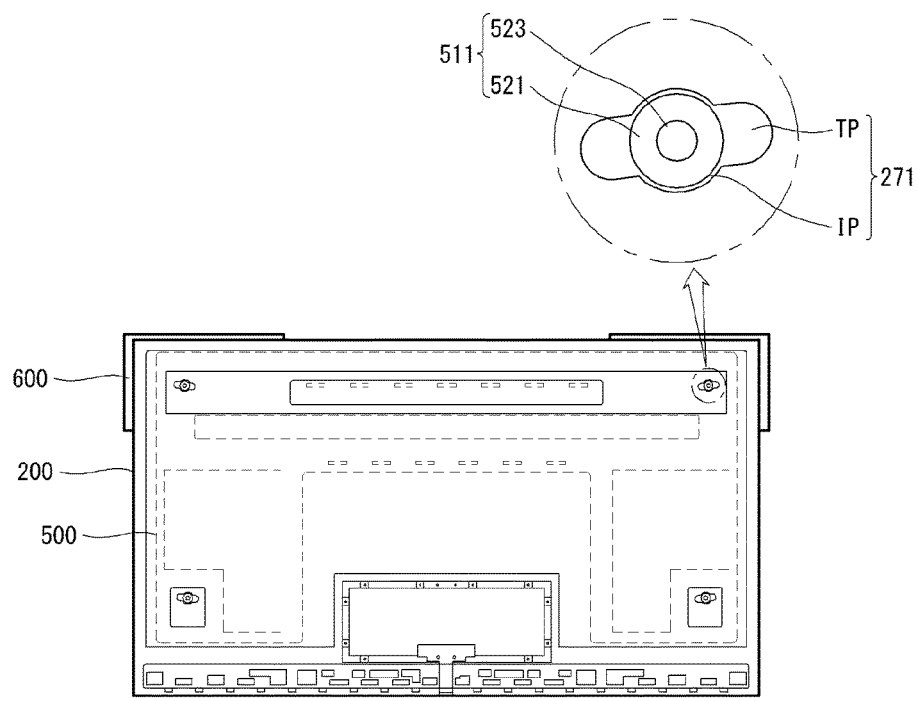

Referring FIG. 35, the module cover 200 may form an opening 271, and the bracket 500 may include a fixing pin 511. The opening 271 may comprise an insertion portion IP and a guide portion TP. A diameter of the insertion portion IP, may be greater than a diameter of the guide portion TP. The insertion portion IP may be overlapped with the guide portion TP. The insertion portion IP may be positioned between both ends of the guide portion TP. The both ends of the guide portion TP may be first and second ends of the guide portion TP. The first end of the guide portion TP, may be disposed at a left side of the insertion portion IP. The second end of the guide portion TP, may be disposed at a right side of the insertion portion IP. The first end of the guide portion TP may be communicated with the second end of the guide portion TP. The insertion portion IP, may form a convex shape in both lateral directions along the longitudinal direction of the guide portion TP. The position of the module cover 200 can be adjusted with respect to the horizontal plane after the insertion of the fixing pin 511 into the opening 271.

Figure 36:
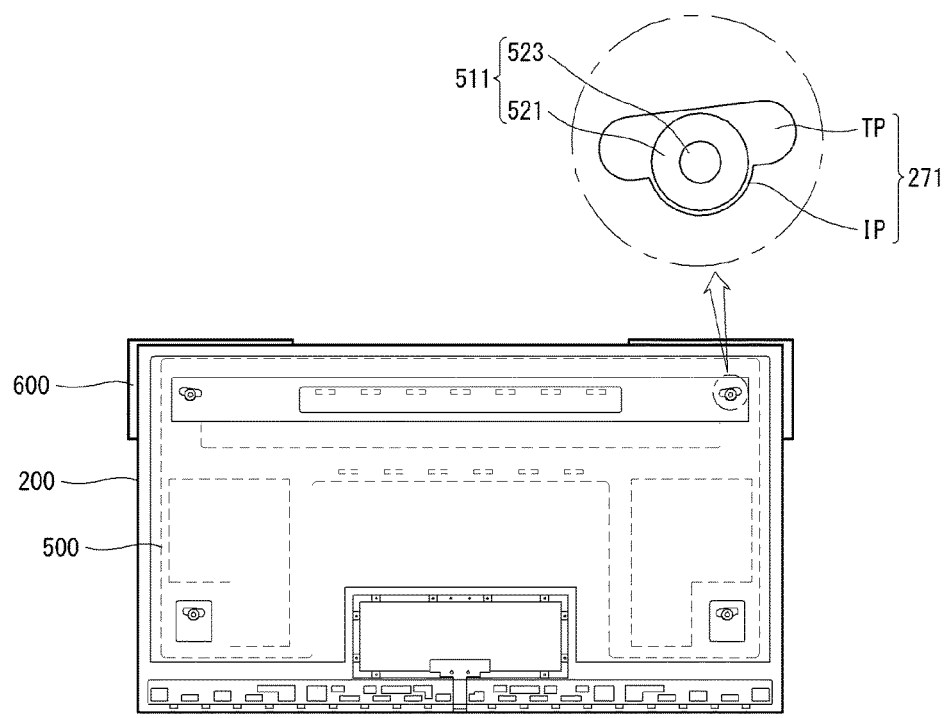

Referring to FIG. 36, the fixing pin 511 may be fastened to the opening 271 formed at the module cover 200. The insertion portion IP may be positioned between both ends of the guide portion TP. The insertion portion IP may form a convex shape in one lateral direction along the longitudinal direction of the guide portion TP. For example, the insertion portion IP may form a convex shape in the lateral direction downward along the longitudinal direction of the guide portion TP. The pin head 521 may pass through the insertion portion IP.

Figure 37:
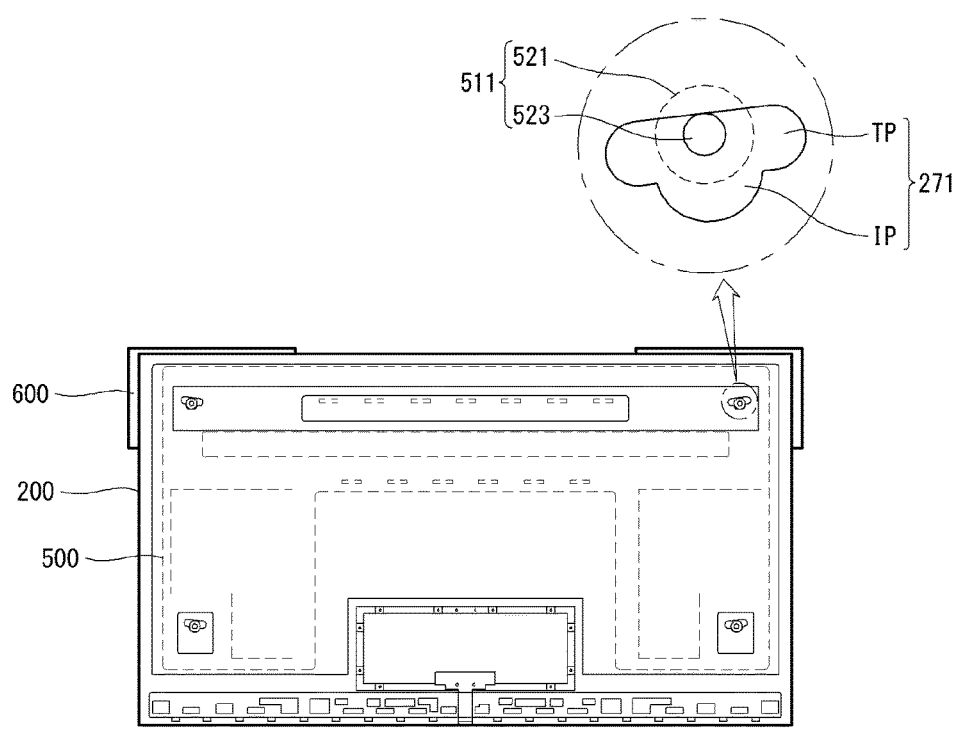

Referring to FIG. 37, when the module cover 200 is lowered after the pin head 521 passes through the inlet IP, the pin neck 523 may be positioned in the guide portion TP. The relative position of the module cover 200 with respect to the bracket 500 may be adjusted after the pin neck 523 is positioned in the guide portion TP.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Certain embodiments or other embodiments of the invention described above are not mutually exclusive or distinct from each other. Any or all elements of the embodiments of the invention described above may be combined or combined with each other in configuration or function.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A display device, comprising:
   a display panel;
   a module cover fastened to a rear side of the display panel; and
   a bracket positioned at a rear of the module cover, the bracket comprising:
      a first pin positioned at a first area of a front of the bracket;
      a second pin positioned at a second area of the front of the bracket;
   wherein the module cover comprises:
   a first opening positioned at a first area of the module cover configured to accommodate the first pin, wherein at least a portion of the first opening is an elongated shape portion; and
   a second opening positioned at a second area of the module cover configured to accommodate the second pin, wherein at least a portion of the second opening is an elongated shape portion;
   wherein at least one of the elongated shape portions of the first opening or the second opening is inclined with respect to a horizontal axis,
   wherein the first pin comprises a pin head having a first width and a pin neck connected to the pin head and having a second width,
   wherein the first width is greater than the second width,
   wherein the first opening is defined to comprise:
      an insertion portion having a width greater than the first width into which the pin head can be inserted; and a guide portion having a width less than the first width but greater than the second width and configured to accommodate the pin neck,
wherein the insertion portion is in communication with the guide portion, and
wherein a first end of the guide portion is disposed at a left side of the insertion portion and a second end of the guide portion is disposed at a right side of the insertion portion.

2. The display device of claim 1, wherein the elongated shape portion of the first opening is angled with respect to the horizontal axis and the elongated shape portion of the second opening is angled with respect to the elongated shape portion of the first opening.

3. The display device of claim 1, wherein the elongated shape portion of the first opening and the elongated shape portion of the second opening are both angled with respect to the horizontal axis.

4. The display device of claim 3, wherein the elongated shape portion of the first opening and the elongated shape portion of the second opening are angled with respect to the horizontal axis at different angles.

5. The display device of claim 1, wherein the first area of the module cover corresponds to first half of a side of the module cover and the second area of the module cover corresponds to a second half of the side of the module cover adjacent to the first half.

6. The display device of claim 1, wherein the guide portion has an elongated shape and the pin is moveable between the first end of the guide portion to the second end of the guide portion.

7. The display device of claim 1, wherein the guide portion is positioned above the insertion portion.

8. The display device of claim 7, wherein:
the first opening is defined to further comprise a link portion between the guide portion and the insertion portion; and
a width of the link portion narrows from a first side near the insertion portion to a second side near the guide portion.

9. The display device of claim 1, wherein the first end of the guide portion and the second end of the guide portion are disposed on opposite sides of the insertion portion.

10. The display device of claim 1, wherein the insertion portion is circular.

11. The display device of claim 1, wherein the first opening and the second opening are symmetric with respect to an axis dividing the first area and the second area of the module cover.

12. The display device of claim 1, wherein the module cover further comprises corresponding forming portions around the first opening and the second opening protruding toward the display panel.

13. The display device of claim 1, wherein the module cover further comprises a friction member disposed around at least a portion of the guide portion at a front side of the module cover, wherein the friction member is configured to contact a rear surface of the pin head to restrict movement of the pin when the pin neck is inserted into the guide portion.

14. The display device of claim 1, wherein a first center axis of the elongated shape portion of the first opening and a second center axis of the elongated shape portion of the second opening correspond to tangent lines to a shared arc.

15. The display device of claim 1, wherein the shared arc corresponds to a circle wherein a center point of the circle is located above the first and second openings.

16. A display device, comprising:
a display panel;
a bracket;
a module cover positioned at a rear of the display panel, the module cover comprising:
a first pin positioned at a first area of the module cover;
a second pin positioned at a second area of the module cover;
wherein the bracket comprises:
a first opening positioned at a first area of the bracket configured to accommodate the first pin, wherein at least a portion of the first opening is an elongated shape portion; and
a second opening positioned at a second area of the bracket configured to accommodate the second pin, wherein at least a portion of the second opening is an elongated shape portion;
wherein at least one of the elongated shape portions of the first opening or the second opening is inclined with respect to a horizontal axis,
wherein the first pin comprises a pin head having a first width and a pin neck connected to the pin head and having a second width,
wherein the first width is greater than the second width,
wherein the first opening is defined to comprise:
an insertion portion having a width greater than the first width into which the pin head can be inserted; and
a guide portion having a width less than the first width but greater than the second width and configured to accommodate the pin neck,
wherein the insertion portion is in communication with the guide portion, and
wherein a first end of the guide portion is disposed at a left side of the insertion portion and a second end of the guide portion is disposed at a right side of the insertion portion.

17. A display device, comprising:
a display panel;
a module cover fastened to a rear side of the display panel; and
a bracket positioned at a rear of the module cover, the bracket comprising:
a first pin positioned at a first area of a front of the bracket;
a second pin positioned at a second area of the front of the bracket;
wherein the module cover comprises:
a first opening positioned at a first area of the module cover configured to accommodate the first pin, wherein at least a portion of the first opening is an elongated shape portion; and
a second opening positioned at a second area of the module cover configured to accommodate the second pin, wherein at least a portion of the second opening is an elongated shape portion;
wherein at least one of the elongated shape portions of the first opening or the second opening is inclined with respect to a horizontal axis,
wherein the first pin comprises a pin head having a first width and a pin neck connected to the pin head and having a second width,
wherein the first width is greater than the second width,
wherein the first opening is defined to comprise:
an insertion portion having a width greater than the first width into which the pin head can be inserted; and a guide portion having a width less than the first width but greater than the second width and configured to accommodate the pin neck,
wherein the insertion portion is in communication with the guide portion,
wherein the module cover further comprises a friction member disposed around at least a portion of the guide portion at a front side of the module cover, and
wherein the friction member is configured to contact a rear surface of the pin head to restrict movement of the pin when the pin neck is inserted into the guide portion.

* * * * *